US012660439B2

(12) United States Patent
Kwon

(10) Patent No.: US 12,660,439 B2
(45) Date of Patent: Jun. 16, 2026

(54) DISPLAY DEVICE

(71) Applicant: LG Display Co., Ltd., Seoul (KR)

(72) Inventor: Hoiyong Kwon, Seoul (KR)

(73) Assignee: LG Display Co., Ltd., Seoul (KR)

( * ) Notice: Subject to any disclaimer, the term of this patent is extended or adjusted under 35 U.S.C. 154(b) by 679 days.

(21) Appl. No.: 17/974,456

(22) Filed: Oct. 26, 2022

(65) Prior Publication Data

US 2023/0189588 A1     Jun. 15, 2023

(30) Foreign Application Priority Data

Dec. 15, 2021     (KR) ........................ 10-2021-0179516

(51) Int. Cl.
| | |
|---|---|
| *H10K 59/131* | (2023.01) |
| *H10K 59/12* | (2023.01) |
| *H10K 59/124* | (2023.01) |
| *H10K 59/35* | (2023.01) |
| *H10K 77/10* | (2023.01) |
| *H10K 102/00* | (2023.01) |

(52) U.S. Cl.
CPC ......... *H10K 59/131* (2023.02); *H10K 59/124* (2023.02); *H10K 59/353* (2023.02); *H10K 77/111* (2023.02); *H10K 59/1201* (2023.02); *H10K 2102/311* (2023.02)

(58) Field of Classification Search
CPC ............... H10K 59/8722; H10K 59/00; H10K 59/8428; H10K 59/131; H10K 59/12; H10K 59/1315; H10K 59/179; H10K 59/82; H10K 59/124; H10K 77/10; H10K 77/111; H10K 2102/311
See application file for complete search history.

(56) References Cited

U.S. PATENT DOCUMENTS

| | | | |
|---|---|---|---|
| 10,847,545 B2 | 11/2020 | Lee et al. | |
| 10,930,880 B2 | 2/2021 | Kim et al. | |
| 2017/0288007 A1 | 10/2017 | Shin et al. | |
| 2018/0122881 A1 | 5/2018 | Shin et al. | |
| 2019/0041915 A1 | 2/2019 | Park et al. | |
| 2021/0074795 A1 | 3/2021 | Tomioka | |
| 2022/0344441 A1* | 10/2022 | Lee ...................... | H10K 59/873 |
| 2025/0072243 A1* | 2/2025 | Tomioka ................ | H05B 33/06 |

FOREIGN PATENT DOCUMENTS

| | | |
|---|---|---|
| CN | 108010939 A | 5/2018 |
| CN | 115241228 A | 10/2022 |
| EP | 3442024 A1 | 2/2019 |
| KR | 20170071047 A | 6/2017 |
| KR | 20180079024 A | 7/2018 |
| KR | 20190016171 A | 2/2019 |
| KR | 20200068439 A | 6/2020 |
| KR | 20200074728 A | 6/2020 |
| KR | 20200140439 A | 12/2020 |
| KR | 20220060517 A | 5/2022 |

* cited by examiner

*Primary Examiner* — Jose R Diaz
(74) *Attorney, Agent, or Firm* — Seed Intellectual Property Law Group LLP

(57) ABSTRACT

A display device according to an embodiment of the present disclosure, the hole is disposed in the inorganic insulating layer in the region overlapping the outer peripheral line of the flexible film or the region adjacent to the outer peripheral line of the flexible film, which makes it possible to suppress the propagation of cracks caused by an air gap in the pad area and improve the reliability of the display device.

17 Claims, 12 Drawing Sheets

100

100

140
130
120
IN
110
150

DISPLAY DEVICE

CROSS-REFERENCE TO RELATED APPLICATIONS

This application claims the priority of Korean Patent Application No. 10-2021-0179516 filed on Dec. 15, 2021, in the Korean Intellectual Property Office, the disclosure of which is incorporated herein by reference.

BACKGROUND

Technical Field

The present disclosure relates to a display device, and more particularly, to a display device that does not use a plastic substrate, thereby improving moisture transmission properties, reducing parasitic capacitance, and minimizing the occurrence and propagation of cracks in a pad area.

Description of the Related Art

Display devices used for a monitor of a computer, a TV set, a mobile phone, and the like include an organic light-emitting display (OLED) device configured to autonomously emit light, and a liquid crystal display (LCD) device that requires a separate light source.

The range of application of the display devices is diversified from the monitor of the computer and the TV set to personal mobile devices, and studies are being conducted on the display devices having wide display areas and having reduced volumes and weights.

In addition, recently, a flexible display device, which is made by forming display elements, lines, and the like on a substrate made of a flexible plastic material having flexibility and thus may display images even by being folded or rolled up, has attracted attention as a next-generation display device.

BRIEF SUMMARY

One technical benefit provided by the present disclosure is the ability to provide a display device that uses a substrate of a transparent conductive oxide layer and an oxide semiconductor layer, instead of a plastic substrate.

One object to be achieved by the present disclosure is to provide a display device that reduces and in some instances can eliminate or minimize penetration of moisture and oxygen.

Still another object to be achieved by the present disclosure is to provide a display device capable of simplifying a process and reducing manufacturing costs by not using a plastic substrate.

Yet another object to be achieved by the present disclosure is to provide a display device capable of reducing the occurrence and propagation of cracks in a region of an outer peripheral line of a flexible film.

Still yet another object to be achieved by the present disclosure is to provide a display device in which a link line is made of the same material as an anode, thereby ensuring a margin of a hole disposed in an inorganic insulating layer.

Objects of the present disclosure are not limited to the above-mentioned objects, and other objects, which are not mentioned above, can be clearly understood by those skilled in the art from the following descriptions.

According to an aspect of the present disclosure, a display device includes: a substrate configured as one of a transparent conductive oxide layer and an oxide semiconductor layer and including a display area including a plurality of sub-pixels, and a non-display area; an insulating layer disposed on the substrate; an active layer disposed on the insulating layer and having a channel region; a plurality of thin-film transistors including a gate electrode, a source electrode, and a drain electrode; and a plurality of light-emitting elements provided on the insulating layer and disposed in the plurality of subpixels, in which the substrate includes a plurality of holes that overlap at least a part of the active layer. Therefore, the substrate may be made of a transparent conductive oxide layer or an oxide semiconductor, and the plurality of holes may be disposed in the substrate. Therefore, it is possible to provide the display device with improved flexibility and reduced parasitic capacitance.

Other detailed matters of the exemplary embodiments are included in the detailed description and the drawings.

According to the present disclosure, it is possible to easily control moisture permeability by using the transparent conductive oxide layer or the oxide semiconductor layer as the substrate of the display device.

According to the present disclosure, it is possible to improve flexibility of the display device by using the thin-film transparent conductive oxide layer or the thin-film oxide semiconductor layer as the substrate of the display device.

According to the present disclosure, the thin-film transparent conductive oxide layer or the thin-film oxide semiconductor layer is used as the substrate of the display device. Therefore, it is possible to reduce stress occurring when the display device is bent or rolled up, thereby reducing cracks in the display device.

According to the present disclosure, it is possible to simplify the structure of the display device and reduce the manufacturing costs by using the transparent conductive oxide layer or the oxide semiconductor layer as the substrate of the display device.

According to the present disclosure, it is possible to reduce static electricity occurring on the substrate and improve the display quality by using the transparent conductive oxide layer or the oxide semiconductor layer as the substrate of the display device.

According to the present disclosure, the substrate of the display device may be manufactured by the deposition process in the vacuum environment. Therefore, it is possible to shorten the substrate manufacturing time and reduce particles occurring on the substrate and defects caused by the particles.

According to the present disclosure, the hole is disposed in the inorganic insulating layer in the region overlapping the outer peripheral line of the flexible film or the region adjacent to the outer peripheral line of the flexible film. Therefore, it is possible to suppress the propagation of cracks caused by an air gap in the pad area and improve the reliability of the display device.

According to the present disclosure, the link line may be formed as the pixel link line, and the hole may be disposed, without constraint in respect to the size, in the inorganic insulating layer in the region adjacent to the outer peripheral line of the flexible film. Therefore, it is possible to more effectively suppress the occurrence of cracks in the inorganic insulating layer.

The effects according to the present disclosure are not limited to the contents exemplified above, and more various effects are included in the present specification.

BRIEF DESCRIPTION OF THE SEVERAL VIEWS OF THE DRAWINGS

The above and other aspects, features and other advantages of the present disclosure will be more clearly understood from the following detailed description taken in conjunction with the accompanying drawings, in which.

DETAILED DESCRIPTION

Figure 1:
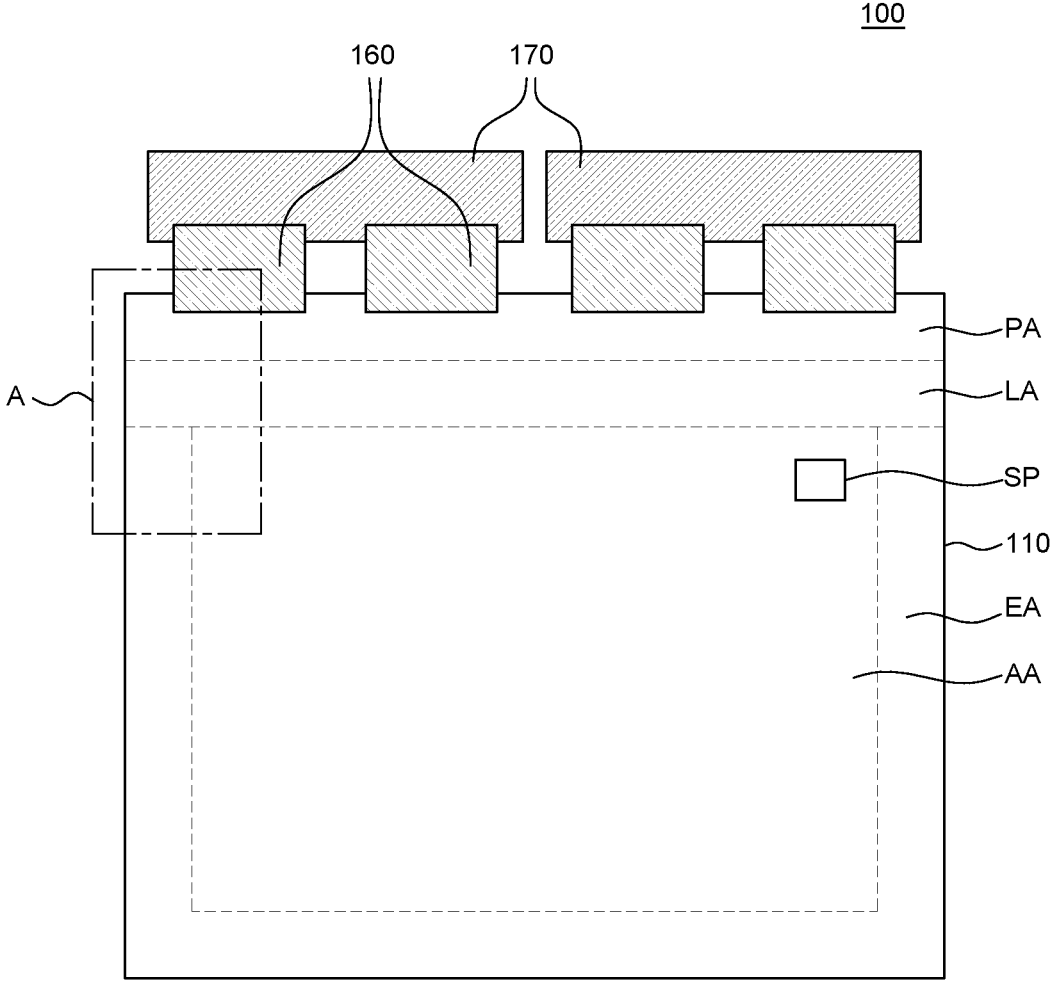
FIG. 1 is a top plan view of a display device according to an embodiment of the present disclosure.

Advantages and characteristics of the present disclosure and a method of achieving the advantages and characteristics will be clear by referring to exemplary embodiments described below in detail together with the accompanying drawings. However, the present disclosure is not limited to the exemplary embodiments disclosed herein but will be implemented in various forms. The exemplary embodiments are provided by way of example only so that those skilled in the art can fully understand the disclosures of the present disclosure and the scope of the present disclosure. The shapes, sizes, ratios, angles, numbers, and the like illustrated in the accompanying drawings for describing the exemplary embodiments of the present disclosure are merely examples, and the present disclosure is not limited thereto. Like reference numerals generally denote like elements throughout the specification. Further, in the following description of the present disclosure, a detailed explanation of known related technologies may be omitted to avoid unnecessarily obscuring the subject matter of the present disclosure. The terms such as "including," "having," and "consist of" used herein are generally intended to allow other components to be added unless the terms are used with the term "only". Any references to singular may include plural unless expressly stated otherwise.

Components are interpreted to include an ordinary error range and manufacturing tolerance even if not expressly stated.

When the position relation between two parts is described using the terms such as "on," "above," "below," and "next," one or more parts may be positioned between the two parts unless the terms are used with the term "immediately" or "directly."

When an element or layer is disposed "on" another element or layer, another layer or another element may be interposed directly on the other element or therebetween.

Although the terms "first," "second," and the like are used for describing various components, these components are not confined by these terms. These terms are merely used for distinguishing one component from the other components. Therefore, a first component to be mentioned below may be a second component in a technical concept of the present disclosure.

A size and a thickness of each component illustrated in the drawing are illustrated for convenience of description, and the present disclosure is not limited to the size and the thickness of the component illustrated.

The features of various embodiments of the present disclosure can be partially or entirely adhered to or combined with each other and can be interlocked and operated in technically various ways, and the embodiments can be carried out independently of or in association with each other.

Hereinafter, various exemplary embodiments of the present disclosure will be described in detail with reference to the accompanying drawings.

Figure 2:
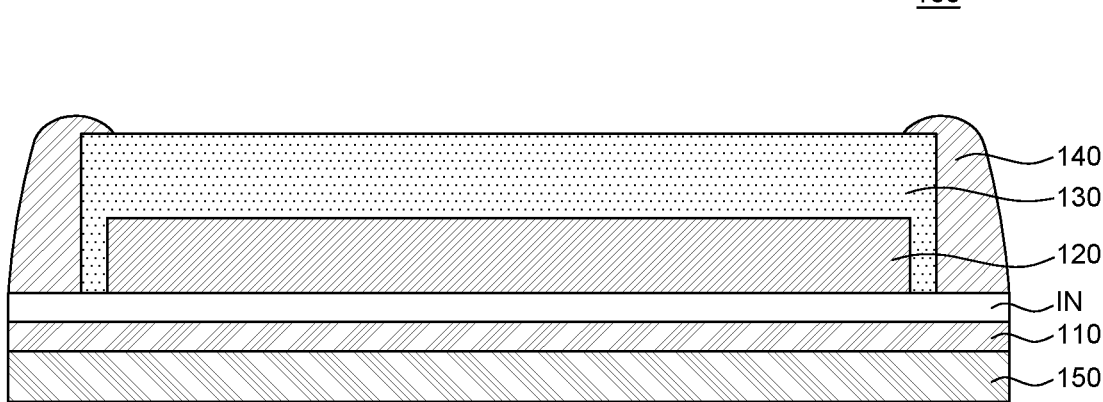
FIG. 2 is a schematic cross-sectional view of the display device according to the embodiment of the present disclosure.

FIG. 1 is a top plan view of a display device according to an embodiment of the present disclosure. FIG. 2 is a schematic cross-sectional view of the display device according to the embodiment of the present disclosure. For the convenience of description, FIG. 1 illustrates only a substrate 110, a plurality of flexible films 160, and a plurality of printed circuit boards 170 among various constituent elements of a display device 100.

Referring to FIGS. 1 and 2, the substrate 110 is a support member for supporting the other constituent elements of the display device 100. The substrate 110 may be made of any one of a transparent conductive oxide and an oxide semiconductor. For example, the substrate 110 may be made of transparent conductive oxide (TCO) such as indium tin oxide (ITO), indium zinc oxide (IZO), and indium tin zinc oxide (ITZO).

In addition, the substrate 110 may be made of an oxide semiconductor material containing indium (In) and gallium (Ga), for example, a transparent oxide semiconductor such as indium gallium zinc oxide (IGZO), indium gallium oxide (IGO), and indium tin zinc oxide (ITZO). However, the material types of transparent conductive oxide and oxide semiconductors are exemplarily provided. The substrate 110 may be made of other transparent conductive oxide and oxide semiconductor materials that are not disclosed in the present specification. However, the present disclosure is not limited thereto.

Meanwhile, the substrate 110 may be formed by depositing the transparent conductive oxide or oxide semiconductor with a very small thickness. Therefore, the substrate 110 may have flexibility as the substrate 110 has a very small thickness. Further, the display device 100 including the substrate 110 having flexibility may be implemented as a flexible display device 100 that may display images even though the display device 100 is folded or rolled up. For example, in the case in which the display device 100 is a foldable display device, the substrate 110 may be folded or unfolded about a folding axis. As another example, in the case in which the display device 100 is a rollable display device, the display device may be rolled up around a roller and stored. Therefore, the display device 100 according to the embodiment of the present disclosure may be implemented as a flexible display device 100 such as a foldable display device or a rollable display device by using the substrate 110 having flexibility.

In addition, the display device 100 according to the embodiment of the present disclosure may perform a laser lift off (LLO) process by using the substrate 110 made of the transparent conductive oxide or oxide semiconductor. The LLO process means a process of separating a temporary substrate, which is disposed below the substrate 110, from the substrate 110 by using a laser during a process of manufacturing the display device 100. Therefore, the substrate 110 is a layer for further facilitating the LLO process, and thus the substrate 110 may be referred to as a functional thin-film, a functional thin-film layer, or a functional substrate. The LLO process will be described below in more detail.

The substrate 110 includes a display area AA and a non-display area NA.

The display area AA is an area including a plurality of subpixels SP to display images. To display an image, a pixel unit 120 including the plurality of subpixels SP may be disposed in the display area AA. For example, the pixel unit 120 may include the plurality of subpixels SP including light-emitting elements and drive circuits, thereby displaying the image.

The non-display area NA is an area disposed at an outer periphery of the display area AA and displays no image. The non-display area NA may be disposed to surround the display area AA.

The non-display area NA includes a pad area PA, a link area LA disposed between the display area AA and the pad area PA, and a peripheral area EA of the display area AA.

The link area LA extends from one side of the display area AA. The link area LA is an area in which a plurality of link lines is disposed to connect a plurality of pad electrodes and the plurality of subpixels SP and transmit a signal to the display area AA. Various link lines may be disposed in the pad area PA. For example, a data link line, a gate link line, and a high-potential voltage supply link line may be disposed in the link area LA.

The pad area PA is an area in which no image is displayed. The plurality of pad electrodes is disposed in the pad area PA. The pad area PA extends from one side of the link area LA. The pad area PA is an area in which the plurality of pad electrodes and an external module such as the flexible film 160 are bonded and electrically connected.

The peripheral area EA extends from a lateral portion of another display area AA in which the link area LA is not disposed. The peripheral area EA may extend from three lateral portions of the display area AA. For example, a gate drive circuit may be disposed in the peripheral area EA.

The plurality of flexible films 160 is disposed at one end of the substrate 110. The plurality of flexible films 160 is electrically connected to one end of the substrate 110. The plurality of flexible films 160 is a film having various types of components disposed on a base film having ductility in order to supply signals to the plurality of subpixels in the display area AA. The plurality of flexible films 160 may have one end disposed in the non-display area NA of the substrate 110 and supply a data voltage or the like to the plurality of subpixels SP in the display area AA. Meanwhile, FIG. 1 illustrates four flexible films 160. However, the number of flexible films 160 may be variously changed in accordance with design. However, the present disclosure is not limited thereto.

The printed circuit boards 170 are connected to the plurality of flexible films 160. The printed circuit board 170 is a component for supplying a signal to a drive IC. Various types of components for supplying the drive IC with various driving signals such as driving signals, data voltages may be disposed on the printed circuit board 170. Meanwhile, FIG. 1 illustrates two printed circuit boards 170. However, the number of printed circuit boards 170 may be variously changed in accordance with design. The present disclosure is not limited thereto.

Referring to FIG. 2, an insulating layer IN is disposed on the substrate 110. The insulating layer IN may inhibit moisture and/or oxygen penetrating from the outside of the substrate 110 from being diffused. Moisture transmission properties of the display device 100 may be controlled by controlling a thickness or a layered structure of the insulating layer IN. In addition, the insulating layer IN inhibits the substrate 110 made of the transparent conductive oxide or oxide semiconductor from being short-circuited while coming into contact with other components such as the pixel unit 120. The insulating layer IN may be made of an inorganic material, for example, configured as a single layer or a multilayer made of silicon oxide (SiOx) or silicon nitride (SiNx). However, the present disclosure is not limited thereto.

The pixel unit 120 is disposed on the insulating layer IN. The pixel unit 120 may be disposed to correspond to the display area AA. The pixel unit 120 includes the plurality of subpixels SP and is configured to display the image. The pixel unit 120 is comprised of a number of components and various layers that include transistors, conductors, semiconductors, insulators, light emitting materials and other materials and layers that have the circuits that make up the pixels, as well as the circuits to drive and control the pixels. The details of the pixel unit are not shown for ease of reference since its structure can be any of those well known in the art. The plurality of subpixels SP of the pixel unit 120 is a minimum unit constituting the display area AA. The light-emitting element and the drive circuit may be disposed in each of the plurality of subpixels SP. For example, the light-emitting element of each of the plurality of subpixels SP may include an organic light-emitting element including an anode, an organic light-emitting layer, and a cathode or include an LED including N-type and P-type semiconductor layers and a light-emitting layer. However, the present disclosure is not limited thereto. Further, the drive circuit for operating the plurality of subpixels may include driving elements such as a thin-film transistor and a storage capacitor. However, the present disclosure is not limited thereto. Hereinafter, for the convenience of description, an assumption is made that the light-emitting element of each of the plurality of subpixels SP is an organic light-emitting element. However, the present disclosure is not limited thereto.

Meanwhile, the display device 100 may be a top-emission type display device or a bottom-emission type display device depending on a direction in which light is emitted from the light-emitting element.

The top-emission type display device allows the light emitted from the light-emitting element to propagate toward an upper side of the substrate 110 on which the light-emitting element is disposed. The top-emission type display device may have a reflective layer formed on a lower portion of the anode in order to allow the light emitted from the light-emitting element to propagate toward the upper side of the substrate 110, i.e., toward the cathode.

The bottom-emission type display device allows the light emitted from the light-emitting element to propagate toward a lower side of the substrate 110 on which the light-emitting element is disposed. In the case of the bottom-emission type display device, the anode may be made of only a transparent electrically conductive material and the cathode may be made of a metallic material with high reflectance in order to allow the light emitted from the light-emitting element to propagate toward the lower side of the substrate 110.

Hereinafter, for the convenience of description, the display device 100 according to the embodiment of the present disclosure will be described as being the bottom-emission type display device. However, the present disclosure is not limited thereto.

A sealing layer 130 is disposed to cover the pixel unit 120. The sealing layer 130 may seal the pixel unit 120 and protect the light-emitting element of the pixel unit 120 from outside moisture, oxygen, impact, and the like. The sealing layer 130 may be formed by alternately stacking a plurality of inorganic material layers and a plurality of organic material layers. For example, the inorganic material layer may be made of an inorganic material such as silicon nitride (SiNx), silicon oxide (SiOx), or aluminum oxide (AlOx). The organic material layer may be made of epoxy-based polymer or acrylic polymer. However, the present disclosure is not limited thereto. In addition, the sealing layer 130 may be configured as a face seal type sealing layer. For example, the sealing layer 130 may be formed by applying an ultraviolet-curable or thermosetting sealant onto the entire surface of the pixel unit 120. However, the sealing layer 130 may have various structures and be made of various materials. However, the present disclosure is not limited thereto.

Meanwhile, a sealing substrate may be further disposed on the sealing layer 130. The sealing substrate may be made of a metallic material having a high modulus and high corrosion resistance. For example, the sealing substrate may be made of a material having a modulus as high as about 200 to 900 MPa. The sealing substrate may be made of a metallic material such as aluminum (Al), nickel (Ni), chromium (Cr), iron (Fe), and an alloy of nickel which is easily processed in the form of a foil or thin-film and has high corrosion resistance. Therefore, since the sealing substrate is made of a metallic material, the sealing substrate may be implemented in the form of an ultrathin-film and have protection characteristics strong against outside impact and scratches.

A seal member 140 is disposed to surround side surfaces of the pixel unit 120 and the sealing layer 130. The seal member 140 may be disposed in the non-display area NA and disposed to surround the pixel unit 120 disposed in the display area AA. The seal member 140 may be disposed to surround the side surface of the pixel unit 120 and the side surface of the sealing layer 130, thereby and in some instances fully eliminating the penetration of moisture into the pixel unit 120. For example, the seal member 140 may be disposed to cover a part of a top surface of the insulating layer IN that overlaps the non-display area NA protruding to the outside of the pixel unit 120. The seal member 140 may be disposed to cover a part of the side surface of the sealing layer 130 disposed to surround the pixel unit 120. The seal member 140 may be disposed to cover a part of a top surface of the sealing layer 130.

The seal member 140 may be made of an electrically non-conductive material having elasticity in order to seal the side surface of the pixel unit 120 and increase rigidity of the side surface of the display device 100. In addition, the seal member 140 may be made of a material having bondability. Further, the seal member 140 may further include a moisture absorbent to absorb moisture and oxygen from the outside and reducing the penetration of moisture through a lateral portion of the display device 100. For example, the seal member 140 may be made of a polyimide (PI), polyurethane, epoxy, or acryl-based materials. However, the present disclosure is not limited thereto.

A polarizing plate 150 is disposed below the substrate 110. The polarizing plate 150 may selectively transmit light and reduce the reflection of external light incident on the substrate 110. Specifically, the display device 100 has various metallic materials formed on the substrate 110 and applied to a semiconductor element, a line, and a light-emitting element. Therefore, the external light incident on the substrate 110 may be reflected by the metallic material. The reflection of external light may decrease visibility of the display device 100. In this case, the polarizing plate 150 for suppressing the reflection of external light may be disposed below the substrate 110, thereby improving outdoor visibility of the display device 100. A polarizing plate may also be provided above the sealing layer 130 in addition to or instead of the polarizing plate 150, depending on the design of the display device. However, the polarizing plate 150 may be eliminated in accordance with the implementation of the display device 100.

Meanwhile, although not illustrated in the drawings, a barrier film, together with the polarizing plate 150, may be disposed below the substrate 110. The barrier film may reduce the penetration of moisture and oxygen present outside the substrate 110 into the substrate 110, thereby protecting the pixel unit 120 including the light-emitting element. However, the barrier film may be eliminated in accordance with the implementation of the display device 100. However, the present disclosure is not limited thereto.

Hereinafter, the non-display area NA in which the plurality of flexible films 160 and the plurality of subpixels SP of the pixel unit 120 are disposed will be described in more detail with reference to FIGS. 3 to 5C.

Figure 3:
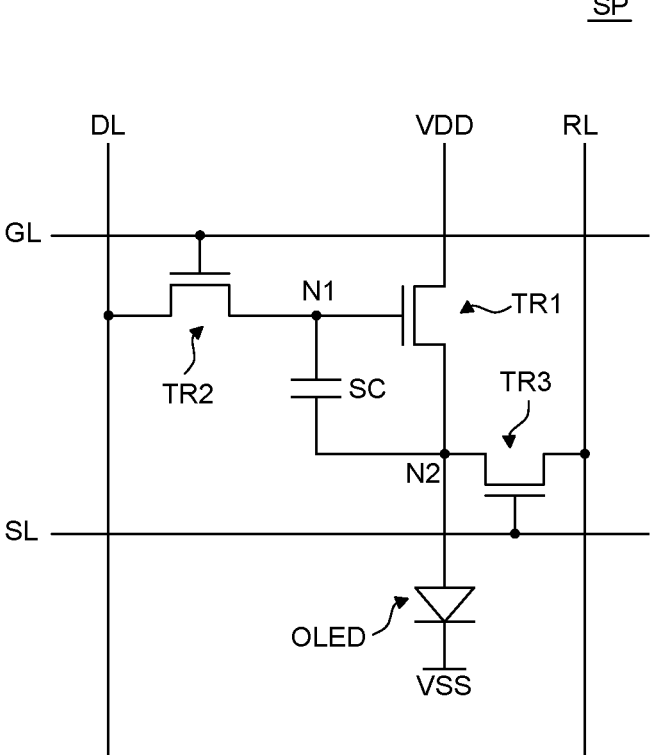
FIG. 3 is a circuit diagram of a subpixel of the display device according to the embodiment of the present disclosure.

FIG. 3 is a circuit diagram of the subpixel of the display device according to the embodiment of the present disclosure.

Referring to FIG. 3, the drive circuit for operating the light-emitting element OLED of each of the plurality of subpixels SP includes a first transistor TR1, a second transistor TR2, a third transistor TR3, and a storage capacitor SC. Further, a plurality of lines is disposed on the substrate 110 in order to operate the drive circuit and includes a gate line GL, a data line DL, a high-potential power line VDD, a sensing line SL, and a reference line RL.

The first transistor TR1, the second transistor TR2, and the third transistor TR3, which are included in the drive circuit of the single subpixel SP, each include a gate electrode, a source electrode, and a drain electrode.

Further, the first transistor TR1, the second transistor TR2, and the third transistor TR3 may each be a P-type thin-film transistor or an N-type thin-film transistor. For example, in the P-type thin-film transistor, positive holes flow from the source electrode to the drain electrode, such that current may flow from the source electrode to the drain electrode. In the N-type thin-film transistor, electrons flow from the source electrode to the drain electrode, such that current may flow from the drain electrode to the source electrode. Hereinafter, the assumption is made that the first transistor TR1, the second transistor TR2, and the third transistor TR3 may each be the N-type thin-film transistor in which current flows from the drain electrode to the source electrode. However, the present disclosure is not limited thereto.

The first transistor TR1 includes a first active layer, a first gate electrode, a first source electrode, and a first drain electrode. The first gate electrode is connected to a first node N1. The first source electrode is connected to the anode of the light-emitting element OLED. The first drain electrode is connected to the high-potential power line VDD. The first transistor TR1 may be turned on when a voltage of the first node N1 is higher than a threshold voltage. The first transistor TR1 may be turned off when the voltage of the first node N1 is lower than the threshold voltage. Further, when the first transistor TR1 is turned on, drive current may be transmitted to the light-emitting element OLED through the first transistor TR1. Therefore, the first transistor TR1 configured to control the drive current to be supplied to the light-emitting element OLED may be referred to as a driving transistor.

The second transistor TR2 includes a second active layer, a second gate electrode, a second source electrode, and a second drain electrode. The second gate electrode is connected to the gate line GL. The second source electrode is connected to the first node N1. The second drain electrode is connected to the data line DL. The second transistor TR2 may be turned on or off on the basis of a gate voltage from the gate line GL. When the second transistor TR2 is turned on, the first node N1 may be charged with the data voltage from the data line DL. Therefore, the second transistor TR2 configured to be turned on or off by the gate line GL may be referred to as a switching transistor.

The third transistor TR3 includes a third active layer, a third gate electrode, a third source electrode, and a third drain electrode. The third gate electrode is connected to the sensing line SL. The third source electrode is connected to a second node N2. The third drain electrode is connected to the reference line RL. The third transistor TR3 may be turned on or off on the basis of a sensing voltage from the sensing line SL. Further, when the third transistor TR3 is turned on, a reference voltage may be transmitted from the reference line RL to the second node N2 and the storage capacitor SC. Therefore, the third transistor TR3 may be referred to as a sensing transistor.

Meanwhile, FIG. 3 illustrates that the gate line GL and the sensing line SL are separate lines. However, the gate line GL and the sensing line SL may be implemented as a single line. However, the present disclosure is not limited thereto.

The storage capacitor SC is connected between the first gate electrode and the first source electrode of the first transistor TR1. That is, the storage capacitor SC may be connected between the first node N1 and the second node N2. The storage capacitor SC may supply a predetermined drive current to the light-emitting element OLED by maintaining a potential difference between the first gate electrode and the first source electrode of the first transistor TR1 while the light-emitting element OLED emits light. The storage capacitor SC includes a plurality of capacitor electrodes. For example, one of the plurality of capacitor electrodes may be connected to the first node N1, and another capacitor electrode may be connected to the second node N2.

The light-emitting element OLED includes the anode, the light-emitting layer, and the cathode. The anode of the light-emitting element OLED is connected to the second node N2, and the cathode is connected to a low-potential power line VSS. The light-emitting element OLED may emit light by receiving the drive current from the first transistor TR1.

Meanwhile, FIG. 3 illustrates that the drive circuit of the subpixel SP of the display device 100 according to the embodiment of the present disclosure has a 3T1C structure including the three transistors and the single storage capacitor SC. However, the number of transistors, the number of storage capacitors SC, and a connection relationship between the transistor and the storage capacitor may be variously changed in accordance with design. The present disclosure is not limited thereto.

Figure 4:
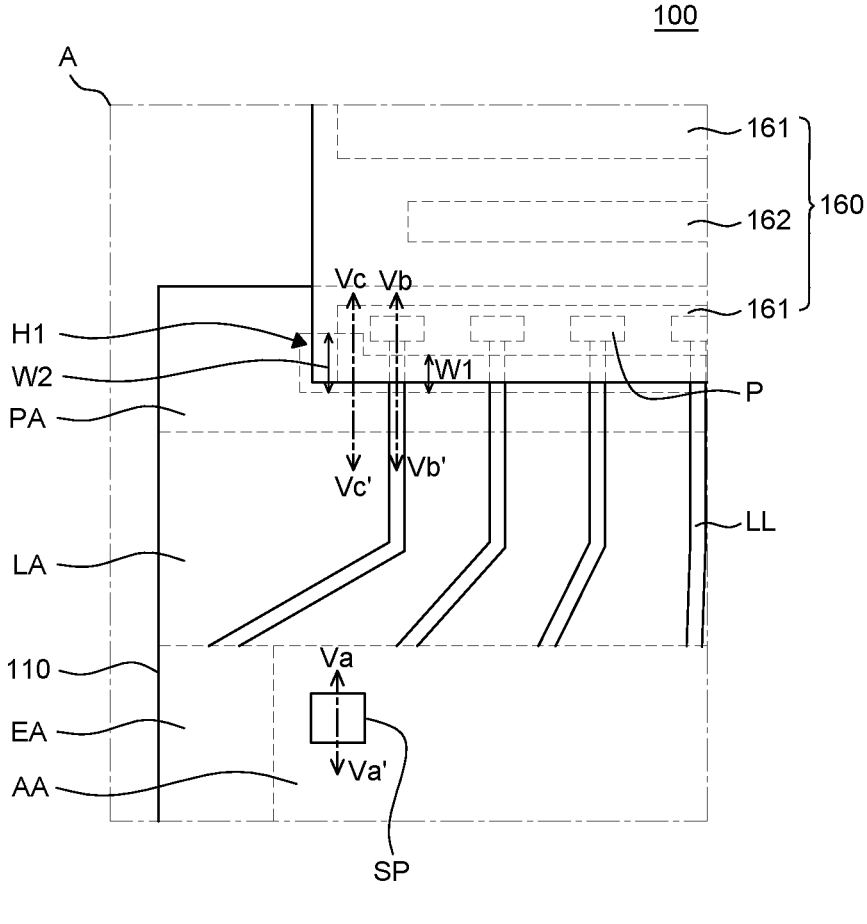
FIG. 4 is an enlarged view of area A in FIG. 1.
Figure 5A:
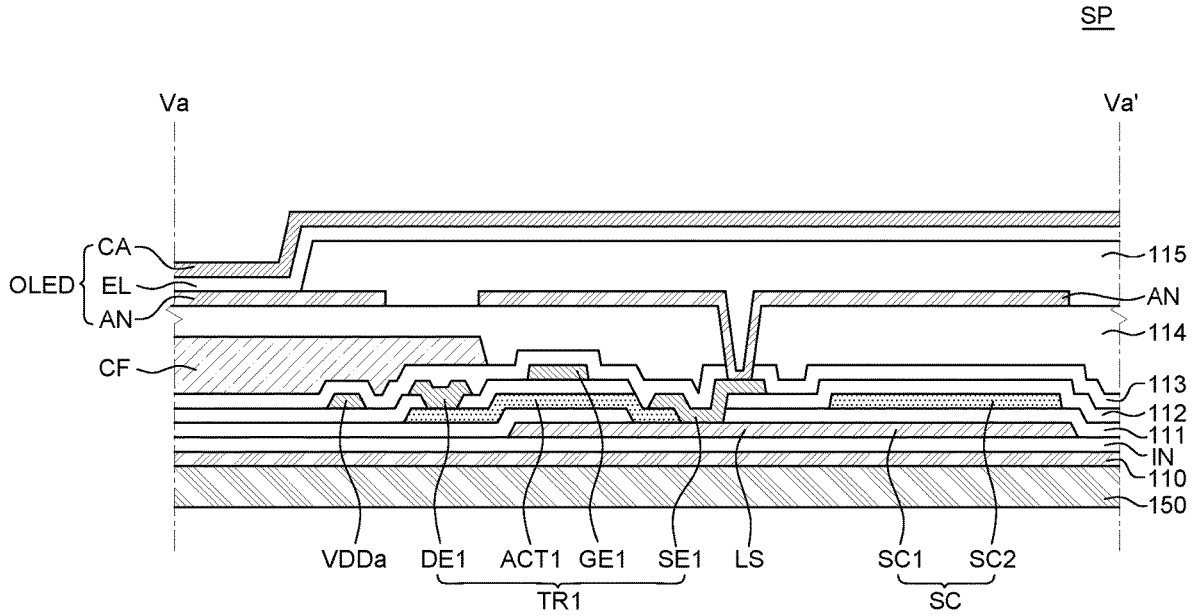
FIGS. 5A to 5C are schematic cross-sectional views taken along lines Va-Va', Vb-Vb', and Vc-Vc' in FIG. 4.
Figure 5B:
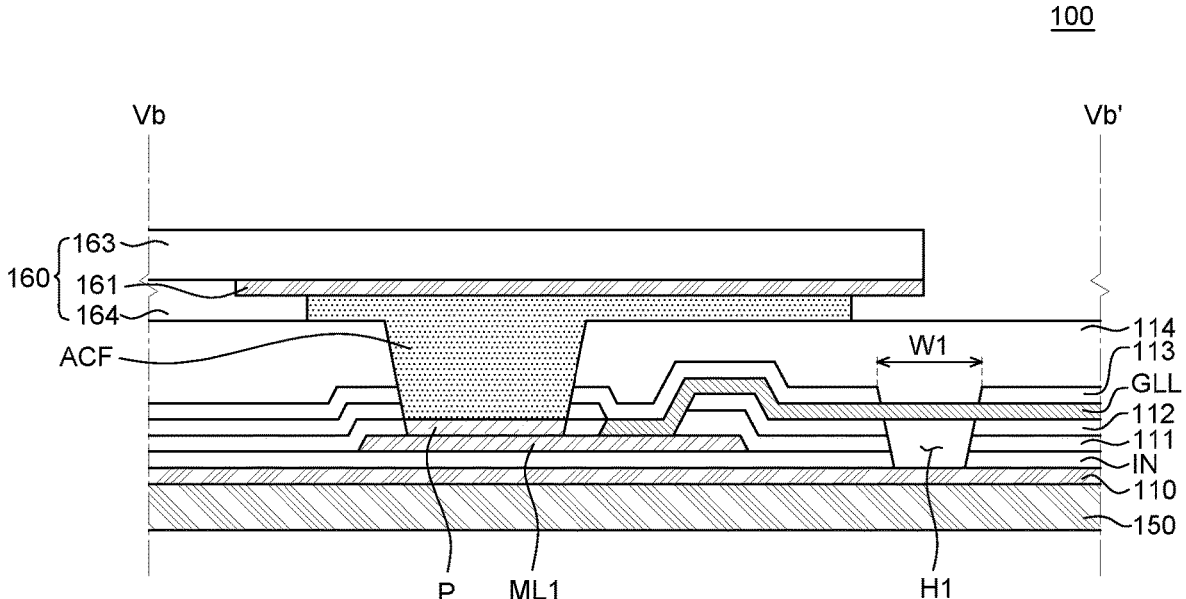
Figure 5C:
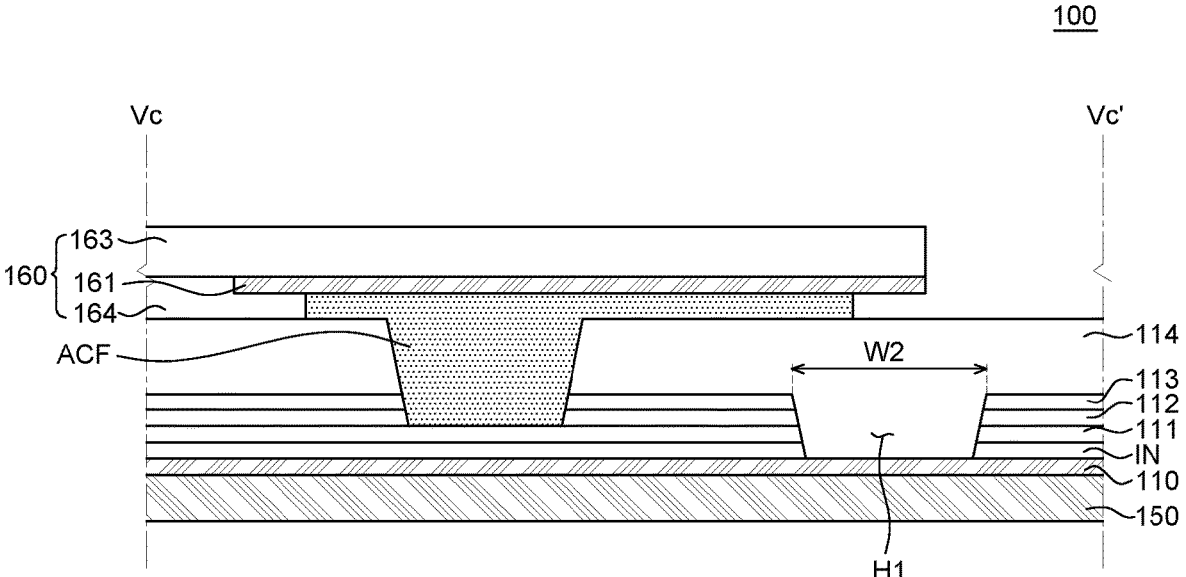

FIG. 4 is an enlarged view of area A in FIG. 1. FIGS. 5A to 5C are schematic cross-sectional views taken along lines Va-Va', Vb-Vb', and Vc-Vc'. For the convenience of illustration, the printed circuit board 170 is not illustrated in FIG. 4. A part of the flexible film 160 and the pad electrode P are illustrated among the components in the pad area PA. The plurality of link lines LL is illustrated among the components in the link area LA. In addition, a part of the display area AA is illustrated. FIG. 5A is a cross-sectional view illustrating one subpixel SP, i.e., a cross-sectional view illustrating a red subpixel. However, the present disclosure is not limited thereto. FIG. 5B is a cross-sectional view illustrating an area in which the link line LL is disposed. FIG. 5C is a cross-sectional view illustrating an area in which the link line LL is not disposed, i.e., illustrating an edge region of the flexible film 160 and a part of the link area LA.

Referring to FIGS. 3 to 5A together, the display device 100 according to the embodiment of the present disclosure includes the substrate 110, the insulating layer IN, a light-blocking layer LS, an auxiliary high-potential power line VDDa, the storage capacitor SC, the first transistor TR1, the light-emitting element OLED, color filters CF, a first inorganic insulating layer 111, a gate insulating layer 112, a second inorganic insulating layer 113, an organic insulating layer 114, and a bank 115.

Although not illustrated in the drawings, the plurality of high-potential power lines VDD, the plurality of data lines DL, the plurality of reference lines RL, and the light-blocking layer LS may be disposed on the same layer on the substrate 110 and made of the same electrically conductive material. For example, the plurality of high-potential power lines VDD, the plurality of data lines DL, the plurality of reference lines RL, and the light-blocking layer LS may be made of an electrically conductive material such as copper (Cu), aluminum (Al), molybdenum (Mo), nickel (Ni), titanium (Ti), chromium (Cr), or an alloy thereof. However, the present disclosure is not limited thereto.

The plurality of high-potential power lines VDD are lines for transmitting high power voltages to each of the plurality of subpixels SP. The plurality of high-potential power lines VDD may extend in the column direction between the plurality of subpixels SP. The two subpixels SP adjacent to each other in the row direction may share a single high-potential power line VDD among the plurality of high-potential power lines VDD.

The plurality of data lines DL are lines that extend in the column direction between the plurality of subpixels SP and transmit the data voltage to each of the plurality of subpixels SP.

The plurality of reference lines RL are lines that extend in the column direction between the plurality of subpixels SP and transmit the reference voltage to each of the plurality of subpixels SP. The plurality of subpixels SP, which constitutes a single pixel, may share the single reference line RL.

Referring to FIG. 5A, the light-blocking layer LS is disposed on the insulating layer IN. The light-blocking layer LS may be disposed to overlap a first active layer ACT1 of at least the first transistor TR1 among the plurality of transistors TR1, TR2, and TR3 and inhibit the light from entering the first active layer ACT1. If the light is irradiated to the first active layer ACT1, a leakage current occurs, which may degrade the reliability of the first transistor TR1 that is a driving transistor. In this case, when the light-blocking layer LS made of an opaque electrically conductive material such as copper (Cu), aluminum (Al), molybdenum (Mo), nickel (Ni), titanium (Ti), chromium (Cr), or an alloy thereof is disposed to overlap the first active layer ACT1, the light-blocking layer LS may inhibit the light from entering to the first active layer ACT1 from the lower side of the substrate 110, thereby improving the reliability of the first transistor TR1. However, the present disclosure is not limited thereto. The light-blocking layer LS may be disposed to overlap a second active layer of the second transistor TR2 and a third active layer of the third transistor TR3.

Meanwhile, the drawings illustrate that the light-blocking layer LS is a single layer. However, the light-blocking layer LS may be provided as a plurality of layers. For example, the light-blocking layer LS may be provided as a plurality of layers disposed to overlap one another with at least any one of the insulating layer IN, the first inorganic insulating layer 111, the gate insulating layer 112, and the second inorganic insulating layer 113 interposed therebetween.

The first inorganic insulating layer 111 is disposed on the plurality of high-potential power lines VDD, the plurality of data lines DL, the plurality of reference lines RL, and the light-blocking layer LS. The first inorganic insulating layer 111 may reduce permeation of moisture or impurities through the substrate 110. Therefore, the first inorganic insulating layer 111 may be referred to as a buffer layer. For example, the first inorganic insulating layer 111 may be configured as a single layer or multilayer made of silicon oxide (SiOx) or silicon nitride (SiNx), but the present specification is not limited thereto. In addition, the first inorganic insulating layer 111 may be eliminated in accordance with the type of the substrate 110 or the type of a transistor, but the present specification is not limited thereto.

The first transistor TR1, the second transistor TR2, the third transistor TR3, and the storage capacitor SC are disposed on the first inorganic insulating layer 111 of each of the plurality of subpixels SP.

Meanwhile, FIG. 5A illustrates a cross-section of the first transistor TR1 among the first transistor TR1, the second transistor TR2, and the third transistor TR3. The first transistor TR1 includes the first active layer ACT1, a first gate electrode GE1, a first source electrode SE1, and a first drain electrode DE1.

The first active layer ACT1 is disposed on the first inorganic insulating layer 111. The first active layer ACT1 may be made of a semiconductor material such as an oxide semiconductor, amorphous silicon, or polysilicon, but the present disclosure is not limited thereto. For example, in the case in which the first active layer ACT1 is made of an oxide semiconductor, the first active layer ACT1 may include a channel area, a source area, and a drain area. The source area and the drain area may be areas having conductivity. However, the present disclosure is not limited thereto.

The gate insulating layer 112 is disposed on the first active layer ACT1. The gate insulating layer 112 may be a layer for insulating the first gate electrode GE and the first active layer ACT1 and made of an insulating material. For example, the gate insulating layer 112 may be configured as a single layer or multilayer made of silicon oxide (SiOx) or silicon nitride (SiNx), but the present disclosure is not limited thereto.

The first gate electrode GE1 is disposed on the gate insulating layer 112 so as to overlap the first active layer ACT1. The first gate electrode GE1 may be made of an electrically conductive material, for example, copper (Cu), aluminum (Al), molybdenum (Mo), nickel (Ni), titanium (Ti), chromium (Cr), or an alloy thereof. However, the present disclosure is not limited thereto.

The first source electrode SE1 and the first drain electrode DE1 are disposed on the gate insulating layer 112 and spaced apart from each other. The first source electrode SE1 and the first drain electrode DE1 may be electrically connected to the first active layer ACT1 through a contact hole formed in the gate insulating layer 112. The first source electrode SE1 and the first drain electrode DE1 may be disposed on the same layer and made of the same electrically conductive material as the first gate electrode GE1. However, the present disclosure is not limited thereto. For example, the first source electrode SE1 and the first drain electrode DE1 may be made of copper (Cu), aluminum (Al), molybdenum (Mo), nickel (Ni), titanium (Ti), chromium (Cr), or an alloy thereof. However, the present disclosure is not limited thereto.

The first drain electrode DE1 is electrically connected to the high-potential power line VDD. In this case, to electrically connect the first drain electrode DE1 to the high-potential power line VDD, the auxiliary high-potential power line VDDa may be further disposed. The auxiliary high-potential power line VDDa has one end electrically connected to the high-potential power line VDD, and the other end electrically connected to the first drain electrode DE1 of each of the plurality of subpixels SP. For example, in the case in which the auxiliary high-potential power line VDDa is disposed on the same layer and made of the same material as the first drain electrode DE1, one end of the auxiliary high-potential power line VDDa may be electrically connected to the high-potential power line VDD through the contact hole formed in the gate insulating layer 112 and the first inorganic insulating layer 111, and the other end of the auxiliary high-potential power line VDDa may extend to the first drain electrode DE1 and be integrated with the first drain electrode DE1.

The first source electrode SE1 may be electrically connected to the light-blocking layer LS through the contact hole formed in the gate insulating layer 112 and the first inorganic insulating layer 111. In addition, a part of the first active layer ACT1 connected to the first source electrode SE1 may be electrically connected to the light-blocking layer LS through the contact hole formed in the first inorganic insulating layer 111. If the light-blocking layer LS floats, the threshold voltage of the first transistor TR1 is changed, which may affect the operation of the display device 100. Therefore, the light-blocking layer LS may be electrically connected to the first source electrode SE1, such that the voltage may be applied to the light-blocking layer LS, and the operation of the first transistor TR1 may not be affected. In the present specification, the configuration has been described in which both the first active layer ACT1 and the first source electrode SE1 are in contact with the light-blocking layer LS. However, only any one of the first source electrode SE1 and the first active layer ACT1 may be in direct contact with the light-blocking layer LS. The present disclosure is not limited thereto.

Meanwhile, FIG. 5A illustrates that the gate insulating layer 112 is formed on the entire surface of the substrate 110. However, the gate insulating layer 112 may be patterned to overlap only the first gate electrode GE1, the first source electrode SE1, and the first drain electrode DE1. However, the present disclosure is not limited thereto.

The storage capacitor SC is disposed in the circuit area of the plurality of subpixels SP. The storage capacitor SC may store a voltage between the first gate electrode GE1 and the first source electrode SE1 of the first transistor TR1 so that the light-emitting element OLED may continuously maintain the same state during a single frame. The storage capacitor SC may include a first capacitor electrode SC1 and a second capacitor electrode SC2.

The first capacitor electrode SC1 is disposed between the insulating layer IN and the first inorganic insulating layer 111 in each of the plurality of subpixels SP. The first capacitor electrode SC1 may be disposed to be closest to the substrate 110 among the conductive constituent elements disposed on the substrate 110. The first capacitor electrode SC1 may be integrated with the light-blocking layer LS. The first capacitor electrode SC1 may be electrically connected to the first source electrode SE1 through the light-blocking layer LS.

The second inorganic insulating layer 113 is disposed on the first transistor TR1, the second transistor TR2, the third transistor TR3, and the storage capacitor SC. The second inorganic insulating layer 113 is an insulating layer for protecting components disposed below the second inorganic insulating layer 113. Therefore, the second inorganic insulating layer 113 may be referred to as a passivation layer. For example, the second inorganic insulating layer 113 may be configured as a single layer or multilayer made of silicon oxide (SiOx) or silicon nitride (SiNx), but the present specification is not limited thereto. In addition, the second inorganic insulating layer 113 may be eliminated in accordance with the embodiments.

The plurality of color filters CF includes a red color filter, a blue color filter, and a green color filter. The red color filter may be disposed in a light-emitting area of a red subpixel among the plurality of subpixels SP. The blue color filter may be disposed in a light-emitting area of a blue subpixel. The green color filter may be disposed in a light-emitting area of a green subpixel.

The organic insulating layer 114 is disposed on the second inorganic insulating layer 113 and the plurality of color filters CF. The organic insulating layer 114 is an insulating layer for flattening the upper portion of the substrate 110 on which the first transistor TR1, the second transistor TR2, the third transistor TR3, the storage capacitor SC, the plurality of high-potential power lines VDD, the plurality of data lines DL, the plurality of reference lines RL, the plurality of gate lines GL, and the plurality of sensing lines SL are disposed. The organic insulating layer 114 may be configured as a single layer or multilayer made of an organic material, for example, polyimide or photo acryl. However, the present disclosure is not limited thereto. The organic insulating layer 114 is more flexible than the first inorganic insulating layer 111 and the inorganic insulating layer 113. Specifically, layer 114 is both somewhat more compressible and stretchable without breaking or cracking than either of layers 111 or 113. Organic insulating layer 114 therefore has a lower modulus of elasticity than inorganic insulating layers 111 and 113.

The light-emitting element OLED is disposed in the light-emitting area of each of the plurality of subpixels SP. The light-emitting element OLED is disposed on the organic insulating layer 114 of each of the plurality of subpixels SP. The light-emitting element OLED includes an anode AN, a light-emitting layer EL, and a cathode CA.

The anode AN is disposed on the organic insulating layer 114 in the light-emitting area. Because the anode AN supplies holes to the light-emitting layer EL, the anode AN may be made of an electrically conductive material having a high work function and may also be referred to as an anode AN. For example, the anode AN may be made of a transparent electrically conductive material such as indium tin oxide (ITO) or indium zinc oxide (IZO), but the present disclosure is not limited thereto.

Meanwhile, the anode AN may extend toward the circuit area. A part of the anode AN may extend from the light-emitting area toward the first source electrode SE1 in the circuit area and be electrically connected to the first source electrode SE1 through the contact hole formed in the organic insulating layer 114 and the second inorganic insulating layer 113. Therefore, the anode AN of the light-emitting element OLED may extend to the circuit area and be electrically connected to the first source electrode SE1 of the first transistor TR1 or the second capacitor electrode SC2 of the storage capacitor SC.

The light-emitting layer EL is disposed on the anode AN in the light-emitting area and the circuit area. The light-emitting layer EL may be configured as a single layer over the plurality of subpixels SP. That is, the light-emitting layers EL of each of the plurality of subpixels SP may be connected to and integrated with one another. The light-emitting layer EL may be configured as a single light-emitting layer. The light-emitting layer EL may have a structure in which a plurality of light-emitting layers configured to emit light beams with different colors is stacked. The light-emitting layer EL may further include organic layers such as a hole injection layer, a hole transport layer, an electron transport layer, and an electron injection layer.

The cathode CA is disposed on the light-emitting layer EL in the light-emitting area and circuit area. Because the cathode CA supplies electrons to the light-emitting layer EL, the cathode CA may be made of an electrically conductive material having a low work function. The cathode CA may be configured as a single layer over the plurality of subpixels SP. That is, the cathodes CA of each of the plurality of subpixels SP may be connected to and integrated with one another. For example, the cathode CA may be made of a transparent electrically conductive material such as indium tin oxide (ITO) or indium zinc oxide (IZO) or made of an alloy of ytterbium (Yb). The cathode CA may further include a metal doping layer, but the present specification is not limited thereto. Meanwhile, although not illustrated in FIGS. 4 and 5A to 5C, the cathode CA of the light-emitting element OLED may be electrically connected to the low-potential power line VSS and receive the low-potential power voltage.

The bank 115 is disposed between the anode AN and the light-emitting layer EL. The bank 115 is disposed to overlap the display area AA and cover an edge of the anode AN. The bank 115 may be disposed at a boundary between the adjacent subpixels SP and reduce mixing of colors of the light beams emitted from the light-emitting element OLED of each of the plurality of subpixels SP. The bank 115 may be made of an insulating material. For example, the bank 115 may be made of polyimide-based resin, acryl-based resin, or benzocyclobutene (BCB)-based resin. However, the present disclosure is not limited thereto.

Referring to FIGS. 4, 5B, and 5C together, the display device 100 according to the embodiment of the present disclosure includes the substrate 110, the insulating layer IN, the first inorganic insulating layer 111, the gate insulating layer 112, the second inorganic insulating layer 113, the organic insulating layer 114, the light-blocking layer LS, the pad electrodes P, a polarizing plate 150, and the flexible film 160.

The plurality of pad electrodes P is disposed on the substrate 110 in the pad area PA. The pad electrode P may be connected to the printed circuit board 170 through the flexible film 160. Meanwhile, the pad electrode P may be connected to the plurality of subpixels SP through gate link lines GLL.

A conductive layer ML1 disposed on the insulating layer IN is connected to the pad electrode P. The plurality of gate link lines GLL may be electrically connected to the pad electrodes P through the conductive layer ML1 disposed in the pad area PA. In this case, the conductive layer ML1 may be provided below the pad electrode P and the gate link line GLL and disposed on the same layer and made of the same material as the light-blocking layer LS. For example, the conductive layer ML1 may be made of an electrically conductive material such as copper (Cu), aluminum (Al), molybdenum (Mo), nickel (Ni), titanium (Ti), chromium (Cr), or an alloy thereof. However, the present disclosure is not limited thereto.

The plurality of flexible films 160 is disposed on the plurality of pad electrodes P and electrically connected to the plurality of pad electrodes P. In this case, the plurality of flexible films 160 and the plurality of pad electrodes P are attached by means of the anisotropic conductive film ACF. The flexible film 160 is pressed, such that the pad electrode P in the pad area PA of the substrate 110 is electrically connected to the flexible film 160 by means of conductive balls in the anisotropic conductive film ACF.

The flexible film 160 includes a pad portion 161, a drive IC 162, a base film 163, and a coating layer 164.

The base film 163 is a layer for supporting the flexible film 160. The base film 163 may be made of an insulating material, e.g., an insulating material having flexibility.

The coating layer 164 may serve to guide the anisotropic conductive film ACF to the flexible film 160. For example, the coating layer 164 may be made of resin, but the present disclosure is not limited thereto.

The pad portion 161 supplies power voltage, data voltages, and the like to the plurality of subpixels SP in the display area AA through the pad electrode P disposed in the pad area PA. The pad portion 161 may be made of an electrically conductive material such as copper (Cu). However, the present disclosure is not limited thereto.

The drive IC 162 is a component configured to process data for displaying an image and process a driving signal for processing the data. The drive IC 162 may be a gate driver IC, a data driver IC, or the like. However, the present disclosure is not limited thereto. The drive IC 162 may be disposed in ways such as a chip-on-glass (COG) method, a chip-on-film (COF) method, and a tape carrier package (TCP) method depending on how the drive IC is mounted. In the present specification, for the convenience of description, the configuration has been described in which the drive ICs 162 are mounted on the plurality of flexible films 160 by the chip-on-film method. However, the present disclosure is not limited thereto.

The plurality of link lines LL is disposed in the link area LA and the pad area PA and connects the data line DL, the gate line GL, and the gate-in panel in the display area AA to the pad electrode P in the pad area PA. FIG. 5B illustrates that the plurality of link lines LL of the display device 100 according to the embodiment of the present disclosure is the gate link lines GLL. However, the present disclosure is not limited thereto.

The gate link line GLL is disposed on the first inorganic insulating layer 111 and the gate insulating layer 112. The gate link line GLL may extend from the gate line GL. That is, the gate link line GLL may be integrated with the gate line GL. The gate link line GLL and the gate line GL may be made of the same electrically conductive material. For example, the gate line GL may be made of copper (Cu), aluminum (Al), molybdenum (Mo), nickel (Ni), titanium (Ti), chromium (Cr), or an alloy thereof. However, the present disclosure is not limited thereto.

The second inorganic insulating layer 113 is disposed on the gate link line GLL. In addition, the organic insulating layer 114 is disposed on the first inorganic insulating layer 111, the plurality of gate link lines GLL, and the second inorganic insulating layer 113.

A hole H1 is disposed in the insulating layer IN, the first inorganic insulating layer 111, the gate insulating layer 112, and the second inorganic insulating layer 113 so as to overlap portions of outer peripheral lines of the flexible film 160 that are disposed on the substrate 110. The hole H1 may be formed by performing dry etching on the insulating layer IN, the first inorganic insulating layer 111, the gate insulating layer 112, and the second inorganic insulating layer 113 disposed in a region of the outer peripheral line of the flexible film 160. In other words, the hole H1 may be formed by etching the first inorganic insulating layer 111, the gate insulating layer 112, the second inorganic insulating layer 113, and the insulating layer IN by using etching gas so that the substrate 110 is exposed through the hole H1. The substrate 110 can be used as an etch stop in one embodiment. In this case, referring to FIG. 5B, the gate link line GLL disposed in the hole H1 may not be etched during the process of etching the insulating layer IN, the first inorganic insulating layer 111, the gate insulating layer 112, and the second inorganic insulating layer 113. That is, the etching process, whether gas, wet etch, dry etch, laser removal or other type of etch, which is used to etch the insulating layer IN, the first inorganic insulating layer 111, the gate insulating layer 112, and the second inorganic insulating layer 113, is selective to not etch the gate link line GLL made of a metallic material. Therefore, the gate link line GLL may remain without change in the hole H1. Therefore, the gate link line GLL may be suspended in the air in the hole after the etch, but before the organic insulating layer 114 is disposed. Thereafter, referring to FIGS. 5B and 5C, when the organic insulating layer 114 is disposed, the hole H1 is filled with the organic insulating layer 114. Therefore, the organic insulating layer 114 may be disposed to surround the gate link line GLL in a region in which the gate link line GLL is disposed. In these locations, the layer 114 fills those portions of the hole H1 that are not filled by the link line LL, in this example the gate link line GLL or other material that might be in the hole. The layer 114 thus completes the filling of the hole. This structure is within the meaning of the phrase that layer 114 fills or filled the hole. In addition, the hole H1 may be fully filled with the organic insulating layer 114 in a region in which no link line LL, such as the gate link line GLL is not disposed.

The term "filled" as used herein to refer to a hole is used in the broad sense to include both fully filled with solely that material and also to include to fill any remaining portion of the hole that is not filled by other materials. Thus, other materials can be in the hole, and the material that completes the filling of the hole can be understood to have filled hole.

Referring to FIG. 4, the hole H1 is disposed to overlap the outer peripheral line adjacent to the link area LA among the outer peripheral lines of the flexible film 160. In addition, the hole H1 is disposed to overlap an edge of the outer peripheral line of the flexible film 160. In this case, a width W1 of the hole H1 adjacent to the link area LA may be smaller than a width W2 of the hole H1 formed in the edge region of the flexible film 160. In the vicinity of the edge of the flexible film 160 at which the gate link line GLL is not disposed, the hole H1 may have a larger size to increase the amount of the organic insulating layer 114 that may absorb more stress, such as impacts, twisting, compression, bending and the like to prevent potential cracks, damage. Since the organic insulating layer 114 is more flexible than the inorganic layers 111 and 113, it acts as buffer to absorb mechanical stress in the structure and reduce or avoid damage to the other layers. However, if the size of the hole H1 is excessively large in the locations in which a link line LL or one of the plurality of gate link lines GLL is disposed in the hole H1, there is some chance that the gate link lines GLL might change significantly deflect, sag or collapse during or after the etch, but before the organic insulating layer 114 is disposed. The width W1 where any link line LL is positioned is selected to ensure that the integrity and function of the electrical connection via the link line LL is not reduced. Therefore, the width W1 of the hole H1 that overlaps with the link line LL may have a smaller than the width W2 of the hole H1 formed in locations where the link line LL does not overlap the hole. In one embodiment, the width of the hole H1 that positioned in the area that is adjacent to link area LA may have a smaller width than the width W2 of the hole H1 formed in the edge region of the flexible film 160 for its entire length In the display device 100 according to the embodiment of the present disclosure, the substrate 110 may be made of a transparent conductive oxide, and the laser-lift-off (LLO) process may be performed. During the process of manufacturing the display device 100, the pixel unit 120 may be formed on the substrate 110 after attaching a temporary substrate having a sacrificial layer to a lower portion of the substrate 110. The sacrificial layer may be made of, for example, hydrogenated amorphous silicon or amorphous silicon hydrogenated and doped with impurities. Further, when laser beams are emitted to the lower portion of the temporary substrate after the display device 100 is completely manufactured, the sacrificial layer may be dehydrogenated, and the sacrificial layer and the temporary substrate may be separated from the substrate 110. In this case, the transparent conductive oxide is a material that may be subjected to the LLO process together with the sacrificial layer and the temporary substrate. Therefore, even though the substrate 110 is made of the transparent conductive oxide, the substrate 110 and the temporary substrate may be easily separated. Therefore, in the display device 100 according to the embodiment of the present disclosure, the substrate 110 is configured as a transparent conductive oxide layer that may be subjected to the LLO process. Therefore, it is possible to easily manufacture the display device 100 even by using a process and an apparatus in the related art.

The anisotropic conductive film may overflow between the flexible film and the organic insulating layer in accordance with the amount or degree of pressure of the anisotropic conductive film that electrically connects the flexible film and the pad electrode. An air gap may be formed between the flexible film and the organic insulating layer. Even though a seal is used to cover the region in which the flexible film and the organic insulating layer overlap each other, the air gap may remain as it is without being filled. In this case, in the case in which the substrate is made of a plastic material, like the related art, a sufficient thickness of the substrate may be ensured, thereby suppressing the occurrence of cracks caused by the air gap. However, in the case in which the substrate is configured as a transparent conductive oxide layer or an oxide semiconductor layer, the substrate has a very small thickness and thus cannot absorb impact caused by the air gap. For this reason, a crack may be formed in the inorganic insulating layer or the link line, and the crack propagates through the inorganic insulating layer or the link line, which may cause an operation defect such as a dark line formed for each block.

In the display device 100 according to the embodiment of the present disclosure, the hole H1 may be disposed in the region that overlaps the outer peripheral line of the flexible film 160 disposed on the substrate 110, thereby reducing the chances for an operation defect and the disconnection between the inorganic insulating layer and the link line LL. Specifically, an air gap may be formed and present for a brief period of time adjacent to the outer peripheral line of the flexible film 160 and formed between the flexible film 160 and the organic insulating layer 114. Therefore, the hole H1 may be disposed in the insulating layer IN, the first inorganic insulating layer 111, the gate insulating layer 112, and the second inorganic insulating layer 113 in the region that overlaps the outer peripheral line of the flexible film 160. Further, the hole H1 may be filled with the organic insulating layer 114. Therefore, it is possible to suppress the occurrence of cracks in the inorganic insulating layer or the link line LL since the stress is absorbed by the layer 114.

In particular, in the display device 100 according to the embodiment of the present disclosure, the edge region of the flexible film 160 is a region in which stress is concentrated in comparison with the other region, and there is some likelihood that cracks will be formed in the edge region of the flexible film 160. Therefore, the hole H1 having a sufficient width may be disposed to overlap the edge region of the flexible film 160, and the hole H1 may be filled with the organic insulating layer 114. Therefore, it is possible to suppress the occurrence of cracks that may be formed in the inorganic insulating layer and the link line LL. Further, it is possible to suppress the propagation of the crack into the display device. Further, it is possible to suppress the operation defect such as a dark line formed for each block because of the crack formed in the link line LL. Therefore, according to the display device 100 according to the embodiment of the present disclosure, the substrate 110 is made of a transparent conductive oxide. Therefore, it is possible to reduce a thickness of the display device 100 and still suppress the propagation of cracks caused by the air gap in the pad area PA, thereby improving the reliability of the display device 100.

Figure 6:
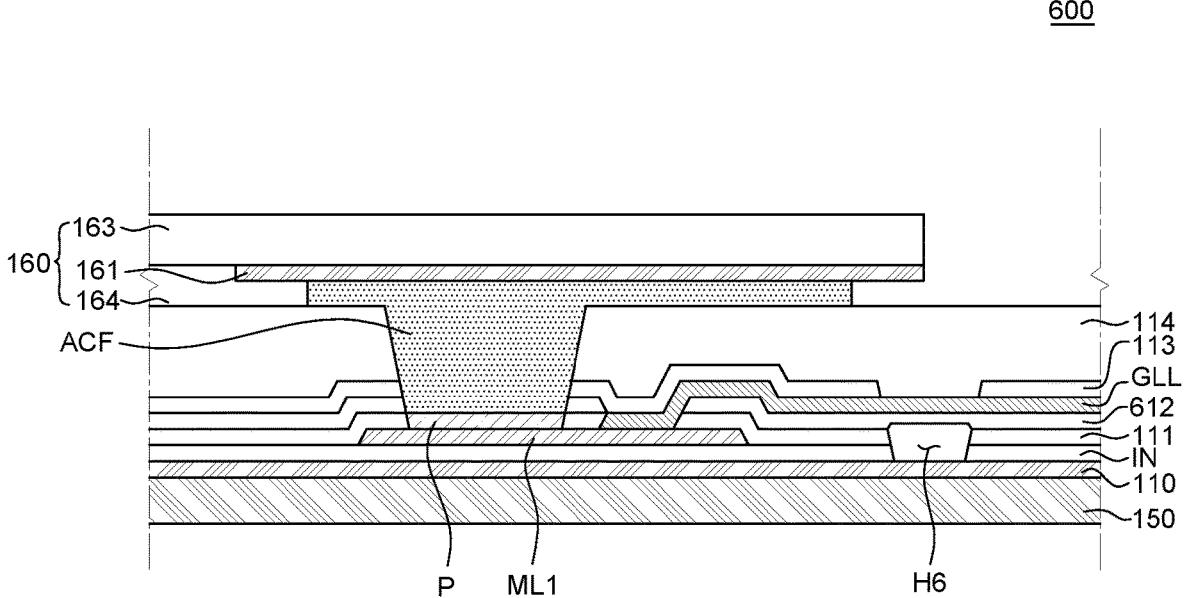
FIG. 6 is a cross-sectional view of a display device according to another embodiment of the present disclosure.

FIG. 6 is a cross-sectional view of a display device according to another embodiment of the present disclosure. A display device 600 illustrated in FIG. 6 is very similar in configuration to the display device 100 illustrated in FIGS. 1 to 5C, except for a gate insulating layer 612 and a hole H6. Therefore, repeated descriptions of the similar or identical components will be omitted.

Referring to FIG. 6, the hole H6 is disposed in the insulating layer IN, the first inorganic insulating layer 111, the gate insulating layer 612, and the second inorganic insulating layer 113. The hole H6 may be formed by performing dry etching on the insulating layer IN, the first inorganic insulating layer 111, the gate insulating layer 612, and the second inorganic insulating layer 113 disposed in the region of the outer peripheral line of the flexible film 160. In this case, referring to FIG. 6, the gate link line GLL disposed in the hole H6 may not be etched during the process of etching the insulating layer IN, the first inorganic insulating layer 111, the gate insulating layer 612, and the second inorganic insulating layer 113. That is, the etching process, whether gas, wet etch or other etch which is used to etch the insulating layer IN, the first inorganic insulating layer 111, the gate insulating layer 612, and the second inorganic insulating layer 113, is selective to not etch the gate link line GLL made of a metallic material. Therefore, the gate link line GLL may be remain without change in the hole H6. Namely, the gate link line GLL may be suspended in the air in the hole H6 after the etch, but before the organic insulating layer 114 is disposed in the hole.

In one embodiment, as shown in FIG. 6, the gate insulating layer 612, which adjoins a bottom surface of the gate link line GLL, may remain in the hole H6. In other words, the GLL might act as an etch shield to the layer just below it. When the etch occurs, some or all of the layer 612 just below the link line LL might not be etched and remains to assist in supporting the GLL. Alternatively, an etch process can be used that is selective to not etch both the link line LL or GLL and also not etch the gate insulating layer 612, but does etch all other material above the substrate layer 110. Therefore, a top surface and a side surface of the gate link line GLL disposed in the hole H6 may adjoin the organic insulating layer 114 when it is deposited, whereas the bottom surface of the gate link line GLL, which overlaps the hole H6, may not adjoin the organic insulating layer 114. During the dry etching process, the hole H6 may be formed as the etching gas sequentially etches the second inorganic insulating layer 113, the gate insulating layer 612, and the first inorganic insulating layer 111. However, when the etching gas becomes plasma, and energy and straightness of ions are high, and the gate insulating layer 612 covered by the gate link line GLL may not be sufficiently etched. Therefore, on the bottom portion of the gate link line GLL that overlaps the hole H6, some or all of the gate insulating layer 612 may remain without being completely etched. That is, a thickness of the gate insulating layer 612 disposed in the hole H6 may be smaller than a thickness of the gate insulating layer H6 disposed outside the hole H6.

In the display device 600 according to another embodiment of the present disclosure, the hole H6 may be disposed in the region that overlaps the outer peripheral line of the flexible film 160 disposed on the substrate 110, thereby minimizing the operation defect and the disconnection between the inorganic insulating layer and the link line LL. Specifically, an air gap may be formed adjacent to the outer peripheral line of the flexible film 160 and formed between the flexible film 160 and the organic insulating layer 114. Therefore, the hole H6 may be disposed in the insulating layer IN, the first inorganic insulating layer 111, the gate insulating layer 612, and the second inorganic insulating layer 113 in the region that overlaps the outer peripheral line of the flexible film 160. Further, the hole H6 may be filled with the organic insulating layer 114. Therefore, it is possible to suppress the occurrence of cracks in the inorganic insulating layer or the link line LL. In addition, according to the display device 600 according to another embodiment of the present disclosure, the substrate 110 is made of a transparent conductive oxide. Therefore, it is possible to reduce a thickness of the display device 600 and suppress the propagation of cracks caused by the air gap in the pad area PA, thereby improving the reliability of the display device 600.

Figure 7:
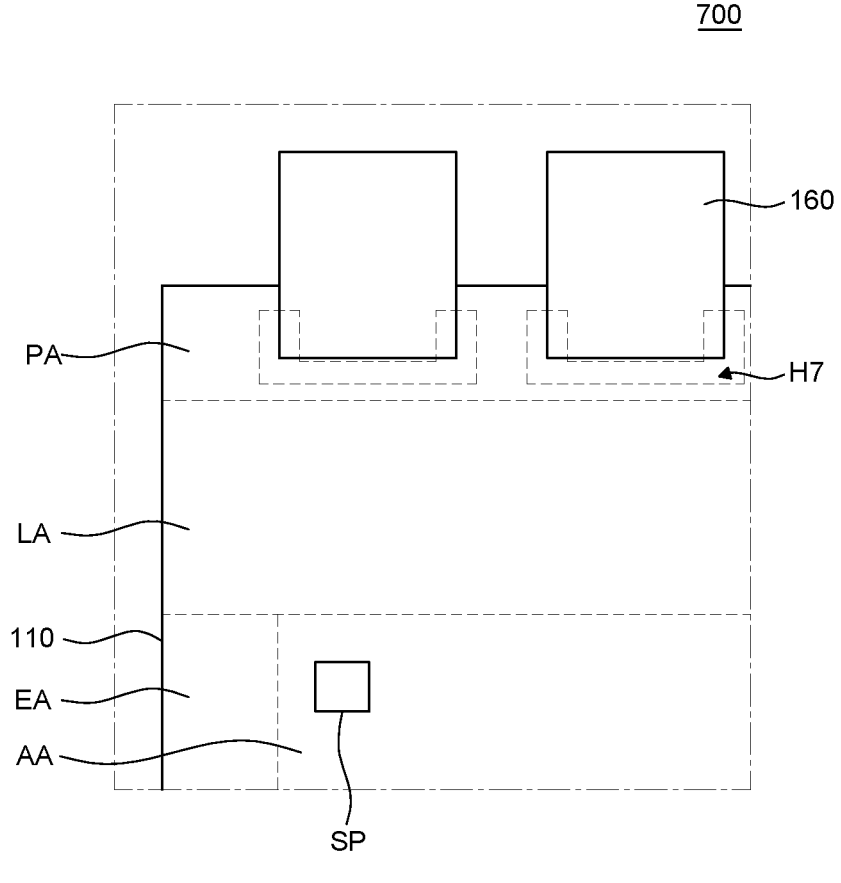
FIG. 7 is an enlarged top plan view of a display device according to still another embodiment of the present disclosure.

FIG. 7 is an enlarged top plan view of a display device according to still another embodiment of the present disclosure. A display device 700 illustrated in FIG. 7 is substantially identical in configuration to the display device 100 illustrated in FIGS. 1 to 5C, except for holes H7. Therefore, repeated descriptions of the identical components will be omitted.

Referring to FIG. 7, the hole H7 is disposed adjacent to the outer peripheral line adjacent to the link area LA among the outer peripheral lines of the flexible film 160. In other words, the hole H7 does not overlap the outer peripheral line adjacent to the link area LA among the outer peripheral lines of the flexible film 160. However, the hole H7 may be disposed in the pad area PA or the link area LA. In this case, a width of the hole H7 adjacent to the link area LA may be smaller than a width of the hole H7 formed in the edge region of the flexible film 160. In the vicinity of the edge of the flexible film 160 at which the gate link line GLL is not disposed, the hole H7 may have a large size to increase the amount of the organic insulating layer 114 that may absorb stress, potential cracks, an impact or other source of cracks. However, if the size of the hole H7 is excessively large in the state in which the plurality of gate link lines GLL is disposed in the hole H7, there is a some chance that the gate link lines GLL collapse before the organic insulating layer 114 is disposed. Therefore, the width of the hole H7 adjacent to the link area LA or where link lines are present may be smaller than the width of the hole H7 formed in the edge region of the flexible film 160. FIG. 7 illustrates that the hole H7 is disposed only in the pad area PA, but the present disclosure is not limited thereto.

In the display device 700 according to still another embodiment of the present disclosure, the holes H7 are disposed in the region adjacent to the outer peripheral line of the flexible film 160 disposed on the substrate 110 and the edge region of the flexible film 160. Therefore, it is possible to reduce the operation defect and the disconnection between the inorganic insulating layer and the link line LL. Specifically, an air gap may be formed adjacent to the outer peripheral line of the flexible film 160 and formed between the flexible film 160 and the organic insulating layer 114. Therefore, the hole H7 may be disposed in the insulating layer IN, the first inorganic insulating layer 111, the gate insulating layer 112, and the second inorganic insulating layer 113 in the pad area PA or the link area LA that is a region adjacent to the outer peripheral line of the flexible film 160. Further, the hole H7 may be filled with the organic insulating layer 114. Therefore, it is possible to suppress the occurrence of cracks in the inorganic insulating layer or the link line LL. In addition, according to the display device 700 according to still another embodiment of the present disclosure, the substrate 110 is made of a transparent conductive oxide. Therefore, it is possible to reduce a thickness of the display device 700 and suppress the propagation of cracks caused by the air gap in the pad area PA, thereby improving the reliability of the display device 700.

Figure 8:
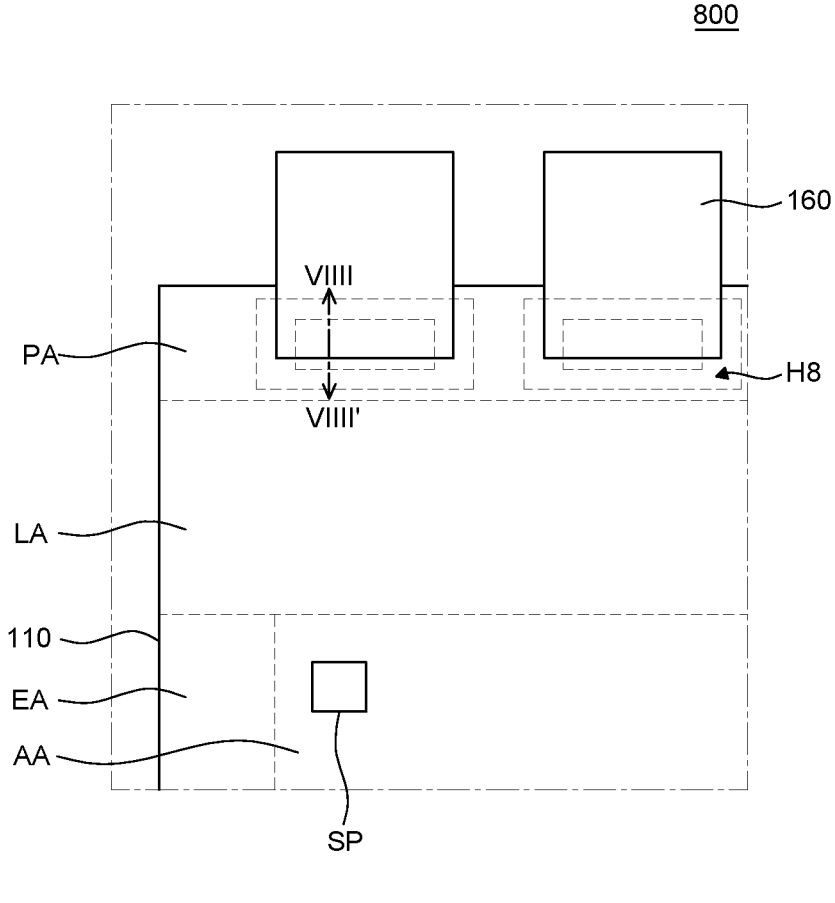
FIG. 8 is an enlarged top plan view of a display device according to yet another embodiment of the present disclosure.
Figure 9:
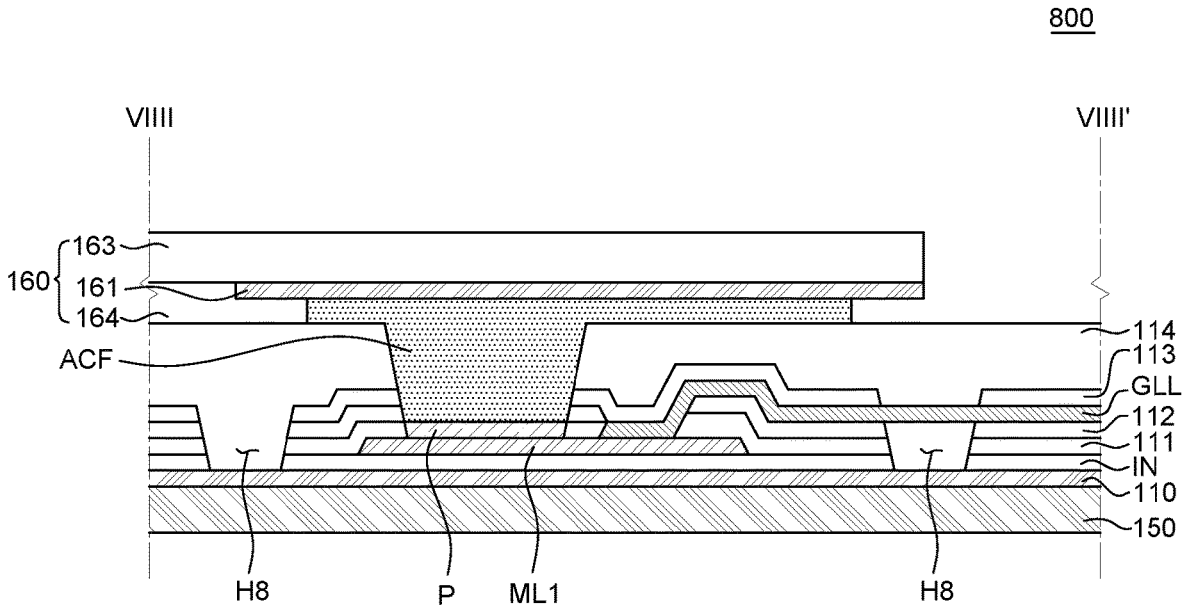
FIG. 9 is a schematic cross-sectional view taken along a line VIIII-VIIII' in FIG. 8.

FIG. 8 is an enlarged top plan view of a display device according to yet another embodiment of the present disclosure. FIG. 9 is a schematic cross-sectional view taken along the line VIIII-VIIII' in FIG. 8. A display device 800 illustrated in FIGS. 8 and 9 is substantially similar in configuration to the display device 100 illustrated in FIGS. 1 to 5C, except for holes H8. Therefore, repeated descriptions of the similar components will be omitted.

Referring to FIGS. 8 and 9 together, the hole H8 may be disposed adjacent to the outer peripheral line adjacent to the link area LA among the outer peripheral lines of the flexible film 160. Further, the hole H8 is disposed adjacent to the outer peripheral line of the substrate 110 disposed in the pad area PA.

The holes H8 may be formed by performing dry etching on the insulating layer IN, the first inorganic insulating layer 111, the gate insulating layer 112, and the second inorganic insulating layer 113 in the region adjacent to the outer peripheral line of the flexible film 160 and the region adjacent to the outer peripheral line of the substrate 110 in the pad area PA.

Referring to FIG. 9, the hole H8 disposed adjacent to the outer peripheral line of the substrate 110 is disposed in a region between the outer peripheral line of the substrate 110 and the hole in which the anisotropic conductive film ACF is disposed. FIGS. 8 and 9 illustrate that the hole H8 adjacent to the link area LA is disposed in the pad area PA. However, the present disclosure is not limited thereto. In addition, the hole H8 is disposed to overlap an edge of the outer peripheral line of the flexible film 160. In this case, a width of the hole H8 adjacent to the link area LA may be smaller than a width of the hole H8 formed in the edge region of the flexible film 160. In the vicinity of the edge of the flexible film 160 at which the gate link line GLL is not disposed, the hole H8 may have a large size to increase the amount of the organic insulating layer 114 that may absorb impact. However, if the size of the hole H8 is excessively large in the state in which the plurality of gate link lines GLL is disposed in the hole H8, there is a likelihood that the gate link lines GLL collapse before the organic insulating layer 114 is disposed. Therefore, the width of the hole H8 adjacent to the link area LA may be smaller than the width of the hole H8 formed in the edge region of the flexible film 160.

In the display device 800 according to yet another embodiment of the present disclosure, the holes H8 are disposed in the region adjacent to the outer peripheral line of the flexible film 160 disposed on the substrate 110, the region adjacent to the outer peripheral line of the substrate 110 disposed in the pad area PA, and the edge region of the flexible film 160. Therefore, it is possible to reduce the operation defect and the disconnection between the inorganic insulating layer and the link line LL. Specifically, an air gap may be formed adjacent to the outer peripheral line of the flexible film 160 and formed between the flexible film 160 and the organic insulating layer 114. Therefore, the hole H8 may be disposed in the insulating layer IN, the first inorganic insulating layer 111, the gate insulating layer 112, and the second inorganic insulating layer 113 in the pad area PA or the link area LA that is a region adjacent to the outer peripheral line of the flexible film 160. Further, the hole H8 may be filled with the organic insulating layer 114. Therefore, it is possible to suppress the occurrence of cracks in the inorganic insulating layer or the link line LL. Additionally, cracks may occur and propagate even in the region adjacent to the outer peripheral line of the substrate 110 disposed in the pad area PA. Therefore, the hole H8 may be disposed in the inorganic insulating layer in the pad area PA that is the region adjacent to the outer peripheral line of the substrate 110. Further, the hole H8 may be filled with the organic insulating layer 114. Therefore, it is possible to suppress the occurrence of cracks in the inorganic insulating layer disposed between the outer peripheral line of the substrate 110 disposed in the pad area PA and the hole in which the anisotropic conductive film ACF is disposed. Further, it is possible to suppress the propagation the formed crack. In addition, according to the display device 800 according to yet another embodiment of the present disclosure, the substrate 110 is made of a transparent conductive oxide. Therefore, it is possible to reduce a thickness of the display device 800 and suppress the propagation of cracks caused by the air gap in the pad area PA, thereby improving the reliability of the display device 800.

Figure 10:
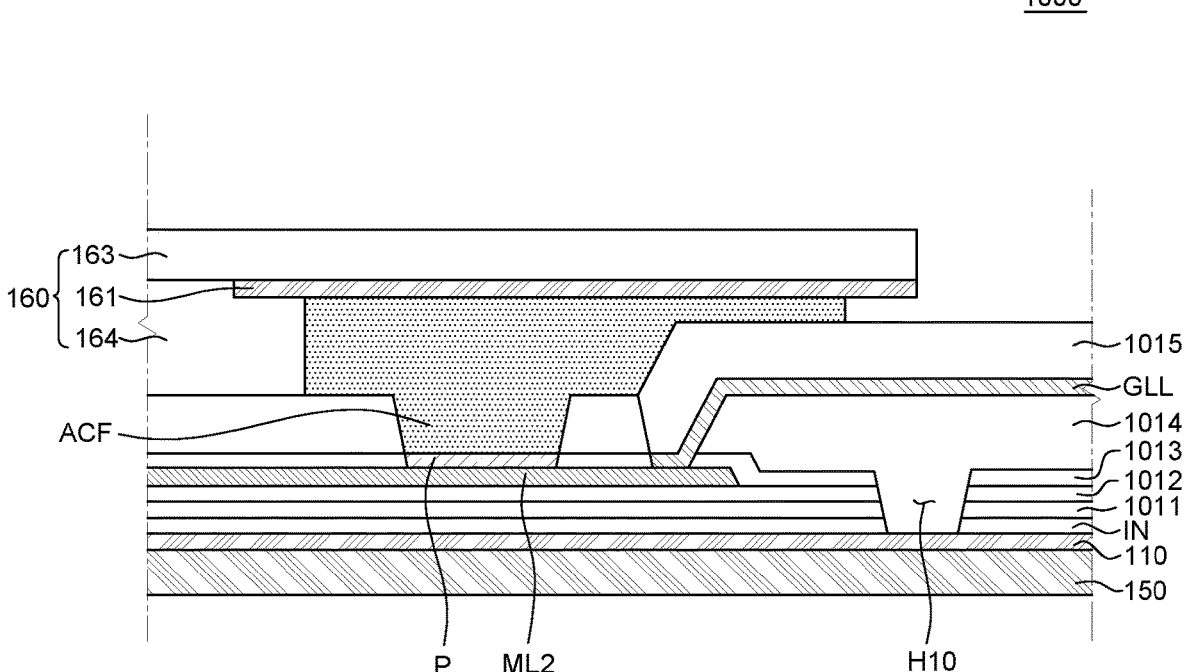
FIG. 10 is a cross-sectional view of a display device according to still yet another embodiment of the present disclosure.

FIG. 10 is a cross-sectional view of a display device according to still yet another embodiment of the present disclosure. The display device according to still yet another embodiment of the present disclosure is substantially identical in configuration to the display device 100 illustrated in FIGS. 1 to 5C, except for a gate link line GLL, a conductive layer ML2, a first inorganic insulating layer 1011, a gate insulating layer 1012, a second inorganic insulating layer 1013, an organic insulating layer 1014, a bank layer 1015, and a hole H10. Therefore, repeated descriptions of the identical components will be omitted.

The conductive layer ML2 is disposed on the first inorganic insulating layer 1011. The conductive layer ML2 may electrically connect the gate link line GLL and the pad electrode P. In this case, the conductive layer ML2 may be formed on the same layer and made of the same material as the first source electrode SE1 or the first drain electrode DE1. For example, the conductive layer ML2 may be made of copper (Cu), aluminum (Al), molybdenum (Mo), nickel (Ni), titanium (Ti), chromium (Cr), or an alloy thereof. However, the present disclosure is not limited thereto.

The plurality of link lines LL is disposed in the link area LA and the pad area PA and connects the data line DL, the gate line GL, and the gate-in panel in the display area AA to the pad electrode P in the pad area PA. FIG. 10 illustrates that the plurality of link lines LL of a display device 1000 according to still yet another embodiment of the present disclosure is the gate link lines GLL. However, the present disclosure is not limited thereto.

The gate link line GLL is disposed on the organic insulating layer 1014. In addition, the bank 1015 is disposed on the gate link line GLL. Meanwhile, the first inorganic insulating layer 1011, the gate insulating layer 1012, the second inorganic insulating layer 1013, and the organic insulating layer 1014 may be disposed below the gate link line GLL.

The gate link line GLL may be made of the same material as the anode AN. That is, the gate link line GLL may be simultaneously formed by the same process as the anode AN. However, the present disclosure is not limited thereto. For example, the gate link line GLL may be made of a transparent electrically conductive material such as indium tin oxide (ITO) or indium zinc oxide (IZO). However, the present specification is not limited thereto.

The bank 1015 is disposed on the gate link line GLL and the gate link line GLL and insulates the anisotropic conductive film ACF and the gate link line GLL. Referring to FIG. 5A, in the display area AA, the bank 115 covers the edge of the anode AN and defines the regions of the adjacent subpixels SP. Meanwhile, referring to FIG. 10, in the non-display area NA, the bank 115 extending from the display area AA may be disposed even in the link area LA and the pad area PA in order to insulate the gate link line GLL, which is disposed on the same layer and made of the same material as the anode AN, from the anisotropic conductive film ACF.

The hole H10 is disposed below the gate link line GLL so as to overlap a portion of the outer peripheral line of the flexible film 160 that is disposed on the substrate 110. The hole H10 may be disposed in the insulating layer IN, the first inorganic insulating layer 1011, the gate insulating layer 1012, and the second inorganic insulating layer 1013. The hole H10 may be formed by performing dry etching on the insulating layer IN, the first inorganic insulating layer 1011, the gate insulating layer 1012, and the second inorganic insulating layer 1013 disposed in a region of the outer peripheral line of the flexible film 160. Thereafter, the hole H10 may be filled with the organic insulating layer 1014. In this case, because no line is disposed in the hole H10, the hole H10 may be fully filled with the organic insulating layer 1014.

The hole H10 may be disposed to overlap the outer peripheral line adjacent to the link area LA among the outer peripheral lines of the flexible film 160. In addition, the hole H10 may be disposed to overlap the edge of the outer peripheral line of the flexible film 160. In this case, because no line is disposed in the hole H10 adjacent to the link area LA, a problem of collapse of the line may not occur. Therefore, in a display device 1000 according to still yet another embodiment of the present disclosure, a width of the hole H10 may be freely selected without constraint in respect to the line.

FIG. 10 illustrates that the hole H10 is disposed to overlap the outer peripheral line adjacent to the link area LA among the outer peripheral lines of the flexible film 160. However, the present disclosure is not limited thereto. For example, the hole H10 does not overlap the outer peripheral line adjacent to the link area LA among the outer peripheral lines of the flexible film 160. However, the hole H10 may be disposed in the pad area PA or the link area LA.

In the display device 1000 according to still yet another embodiment of the present disclosure, the hole H10 is disposed in the region adjacent to the outer peripheral line of the flexible film 160 disposed on the substrate 110 and the edge region of the flexible film 160. Therefore, it is possible to reduce the operation defect and the disconnection between the inorganic insulating layer and the link line LL. Specifically, an air gap may be formed adjacent to the outer peripheral line of the flexible film 160 and formed between the flexible film 160 and the organic insulating layer 1014. Therefore, the hole H10 may be disposed in the insulating layer IN, the first inorganic insulating layer 1011, the gate insulating layer 1012, and the second inorganic insulating layer 1013 in the pad area PA or the link area LA that is a region adjacent to the outer peripheral line of the flexible film 160. Further, the hole H10 may be filled with the organic insulating layer 1014. Therefore, it is possible to suppress the occurrence of cracks in the inorganic insulating layer or the link line LL. In addition, because the gate link line GLL is disposed on the organic insulating layer 1014 in the display device 1000 according to still yet another embodiment of the present disclosure, the gate link line GLL may not be disposed in the hole H10. Therefore, the hole H10 may be disposed in the region adjacent to the outer peripheral line of the flexible film 160 without constraint in respect to the size thereof. Therefore, the hole H10 having desired sizes may be disposed in the inorganic insulating layers in the region adjacent to the outer peripheral line of the flexible film 160 disposed on the substrate 110 and the edge region of the flexible film 160. Therefore, it is possible to more effectively suppress the occurrence of cracks in the inorganic insulating layer. Meanwhile, according to the display device 1000 according to still yet another embodiment of the present disclosure, the substrate 110 is made of a transparent conductive oxide. Therefore, it is possible to reduce a thickness of the display device 1000 and suppress the propagation of cracks caused by the air gap in the pad area PA, thereby improving the reliability of the display device 1000.

In an alternative embodiment, the link layer LL can be position as the first layer on top of the insulation layer IN. It can act as the etch stop for the etching of the hole H1, and thus it is the bottom most layer in the hole H1. In this embodiment, when the organic layer 114 is deposited, it is on top of the link layer LL and fills the rest of the hole. In a further alternative embodiment, the link layer LL can be position as the top of the over the hole, namely the layer 113 is not present and it is on top of layer 112 and is the top most layer when the hole it etched. After the hole is etched, it will be a bridge across the top the hole. In this embodiment, when the organic layer 114 is deposited, it is on top of the link layer LL and fills the hole under the link layer LL and also overlies the link layer LL.

The exemplary embodiments of the present disclosure can also be described as follows:

According to an aspect of the present disclosure, a display device comprising a substrate configured as one of a conductive oxide layer and an oxide semiconductor layer and comprising a display area including a plurality of subpixels and a non-display area disposed at an outer periphery of the display area, the non-display area including a pad area, and a link area disposed between the display area and the pad area; a first inorganic insulating layer disposed on the substrate; a plurality of pad electrodes disposed in the pad area; a plurality of link lines disposed in the link area and configured to connect the plurality of pad electrodes and the plurality of subpixels; a flexible film disposed on the plurality of pad electrodes and electrically connected to the plurality of pad electrodes; and an organic insulating layer disposed on the first inorganic insulating layer and the plurality of link lines, a hole is disposed in the first inorganic insulating layer so as to overlap a portion of an outer peripheral line of the flexible film that is disposed on the substrate, and the hole is filled with the organic insulating layer.

The hole may overlap an edge of the outer peripheral line of the flexible film.

The hole may overlap the outer peripheral line adjacent to the link area among the outer peripheral lines of the flexible film.

The hole may be disposed between the display area and the outer peripheral line adjacent to the link area among the outer peripheral lines of the flexible film.

A hole may be additionally disposed to be adjacent to the outer peripheral line of the substrate disposed in the pad area.

The plurality of link lines is a gate link line or a data link line, and the plurality of link lines may be electrically connected to the pad electrode through a conductive layer disposed in the pad area.

The display device further comprising a second inorganic insulating layer disposed on the plurality of link lines, the plurality of link lines is the gate link line, the gate link line is disposed in the hole, and the hole may be disposed in the second inorganic insulating layer.

A conductive layer configured to electrically connect the gate link line and the pad electrode, the conductive layer may be disposed below the first inorganic insulating layer.

An entire surface of the gate link line disposed in the hole may adjoin the organic insulating layer.

A gate insulating layer disposed above the first inorganic insulating layer and disposed below the gate link line, a top surface and a side surface of the gate link line disposed in the hole adjoin the organic insulating layer, and a bottom surface of the gate link line disposed in the hole may adjoin the gate insulating layer.

The plurality of link lines is disposed on the organic insulating layer, and the hole may be disposed below the plurality of link lines.

A conductive layer configured to electrically connect the plurality of link lines and the pad electrode, the conductive layer may be disposed above the first inorganic insulating layer.

Although the exemplary embodiments of the present disclosure have been described in detail with reference to the accompanying drawings, the present disclosure is not limited thereto and may be embodied in many different forms without departing from the technical concept of the present disclosure. Therefore, the exemplary embodiments of the present disclosure are provided for illustrative purposes only but not intended to limit the technical concept of the present disclosure. The scope of the technical concept of the present disclosure is not limited thereto. Therefore, it should be understood that the above-described exemplary embodiments are illustrative in all aspects and do not limit the present disclosure. The protective scope of the present disclosure should be construed based on the following claims, and all the technical concepts in the equivalent scope thereof should be construed as falling within the scope of the present disclosure.

The various embodiments described above can be combined to provide further embodiments. All of the U.S. patents, U.S. patent application publications, U.S. patent applications, foreign patents, foreign patent applications and non-patent publications referred to in this specification and/or listed in the Application Data Sheet are incorporated herein by reference, in their entirety. Aspects of the embodiments can be modified, if necessary to employ concepts of the various patents, applications and publications to provide yet further embodiments.

These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

The invention claimed is:

1. A display device, comprising:
a substrate having a plurality of subpixels in a display area and a non-display area disposed adjacent to the display area;
a pad area in the non-display area;
a link area disposed between the display area and the pad area;
a first inorganic insulating layer disposed on the substrate in the link area;
a plurality of pad electrodes disposed in the pad area;
a plurality of link lines disposed in the link area and overlying the first inorganic insulating layer, the plurality of link lines being configured to respectively electrically connect the plurality of pad electrodes and the plurality of subpixels;
an organic insulating layer disposed on the plurality of link lines and on the first inorganic insulating layer;
a first hole disposed in the first inorganic insulating layer, the hole located to overlap a portion of at least one link line of the plurality of link lines; and
a gate insulating layer disposed above the first inorganic insulating layer and below a gate link line disposed in the first hole
wherein:
the organic insulating layer is positioned in and fills the first hole;
a top surface and a side surface of the gate link line disposed in the first hole adjoin the organic insulating layer; and
a bottom surface of the gate link line disposed in the first hole adjoins the gate insulating layer.

2. The display device of claim 1, further comprising:
a flexible film disposed on the plurality of pad electrodes and electrically connected to the plurality of pad electrodes, wherein the first hole overlaps an edge of an outer peripheral line of the flexible film.

3. The display device of claim 2, wherein the first hole overlaps the outer peripheral line adjacent to the link area among the outer peripheral lines of the flexible film.

4. The display device of claim 2, wherein the first hole is disposed between the display area and the outer peripheral line adjacent to the link area among the outer peripheral lines of the flexible film.

5. The display device of claim 1, further comprising:
a second hole disposed adjacent to an outer peripheral line of the substrate disposed in the pad area.

6. The display device of claim 1, wherein;
the plurality of link lines includes at least one of a data link line; and
each of the plurality of link lines are electrically connected to a pad electrode through a conductive layer disposed in the pad area.

7. The display device of claim 5, further comprising:
a second inorganic insulating layer disposed on the plurality of link lines, wherein:
the gate link line is disposed in the second hole; and
the second hole is disposed in the second inorganic insulating layer.

8. The display device of claim 7, further comprising:
a conductive layer configured to electrically connect the gate link line and a pad electrode,
wherein the conductive layer is disposed below the first inorganic insulating layer.

9. The display device of claim 1, wherein the plurality of link lines is disposed on the organic insulating layer, and the first hole is disposed below the plurality of link lines.

10. The display device of claim 1, further comprising:
a conductive layer configured to electrically connect the plurality of link lines and at least one pad electrode,
wherein the conductive layer is disposed above the first inorganic insulating layer.

11. A display device, comprising:
a substrate having a display area and a non-display area disposed adjacent to the display area;
a plurality of pixels in the display area;
a first insulating layer on the substrate;
a pad area in the non-display area;
a plurality of pad electrodes disposed in the pad area;
a link area located between the display area and the pad area;
a plurality of insulating layers positioned on the first insulating layer in the link area;
a plurality of conductive lines disposed in the link area and positioned on the plurality of insulating layers, the conductive lines being configured to electrically connect the plurality of pad electrodes to the plurality of subpixels, respectively;
an second insulating layer overlying the plurality of conductive lines in the link area;
a hole disposed in the plurality of insulating layers and the second insulating layer, the hole located to overlap at least one of the conductive lines;
an organic insulating layer filling the hole and enclosing the at least one conductive line, and
a flexible film disposed on the plurality of pad electrodes and electrically connected to the plurality of pad electrodes, the flexible film being located to overlap the hole in the plurality of insulating layers, the second insulating layer and the organic insulating layer filling the hole.

12. The display device of claim 11, wherein the organic insulating layer filling the hole is in direct physical contact with the at least one conductive line on the top and two sides thereof.

13. The display device of claim 12, wherein the organic insulating layer filling the hole is in direct physical contact with the at least one conductive line on the bottom thereof.

14. A method of making the display device of claim 11, the method comprising:

forming the display area on the substrate, the display area including a pixel area having a plurality of light emitting pixels therein;

forming the non-display area on the substrate adjacent to the pixel area, the non-display area including the link area and the pad area;

depositing the first insulating layer on the substrate, the first insulating layer being disposed into both the display area and the non-display area;

depositing the plurality of insulating layers on the first insulating layer, the plurality of insulating layers being disposed in the link area;

forming a conductive pad in the pad area;

depositing a conductive link line on the plurality of insulating layers, the conductive link line extending from the pad area, through the link area and into the display area;

depositing the second insulating layer overlying the conductive link line in the pad area and in the link area;

forming the hole extending through the second insulating layer and the plurality of insulating layers in the link area, the conductive link line not being removed and being exposed within the hole after the hole is formed; and filling the hole with the organic insulating layer that encloses the conductive link line within the hole on at least three sides thereof.

15. The method of claim 14, wherein the step of forming the hole in the link area includes:

removing the second insulating layer and the plurality of insulating layers with an etch process that does not remove the conductive link line or the first insulating layer.

16. The method of claim 15, wherein the conductive link line is suspended in the hole after the hole is formed and before the organic insulating layer fills the hole.

17. The method of claim 14, wherein the organic conductive layer is in direct contact with at least three surfaces of the conductive link line and at least one layer of the plurality of conductive layers is in contact with the conductive link line when the conductive link line is enclosed by the organic conductive layer.

* * * * *